US012431427B2

(12) United States Patent
Huang

(10) Patent No.: US 12,431,427 B2
(45) Date of Patent: Sep. 30, 2025

(54) SEMICONDUCTOR DEVICE STRUCTURE WITH LINER LAYER HAVING TAPERED SIDEWALL AND METHOD FOR PREPARING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 424 days.

(21) Appl. No.: 18/094,507

(22) Filed: Jan. 9, 2023

(65) Prior Publication Data
US 2024/0234313 A1    Jul. 11, 2024

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76805* (2013.01); *H01L 21/76831* (2013.01); *H01L 21/76843* (2013.01); *H01L 21/76877* (2013.01); *H01L 23/5226* (2013.01); *H01L 23/53238* (2013.01)

(58) Field of Classification Search
CPC ............. H01L 23/5283; H01L 23/5226; H01L 23/53238; H01L 23/5222; H01L 23/53295; H01L 23/527; H01L 21/76805; H01L 21/76831; H01L 21/76843;
(Continued)

(56) References Cited

U.S. PATENT DOCUMENTS 6,509,267 B1 *  1/2003  Woo .................. H01L 21/76801
                                                    438/678
11,652,025 B2 *  5/2023  Shih .................... H10F 39/8053
                                                    257/621
(Continued)

FOREIGN PATENT DOCUMENTS

CN        110828373 A     2/2020
DE    102021100840 A1     7/2022
TW        201535740 A     9/2015

OTHER PUBLICATIONS

Office Action and and the search report mailed on Oct. 16, 2024 related to Germany Application No. 10 2023 115 196.7.
(Continued)

*Primary Examiner* — David Tung
(74) *Attorney, Agent, or Firm* — Xuan Zhang

(57) ABSTRACT

A semiconductor device structure includes a first dielectric layer disposed over a semiconductor substrate, and a second dielectric layer disposed over the first dielectric layer. The semiconductor device structure also includes a spacer structure disposed in the second dielectric layer, and a conductive structure penetrating through the second dielectric layer and extending into the first dielectric layer. The conductive structure is surrounded by the spacer structure. The semiconductor device structure further includes a liner layer separating the conductive structure from the first dielectric layer, the second dielectric layer and the spacer structure. The liner layer has a tapered sidewall in direct contact with the first dielectric layer.

18 Claims, 20 Drawing Sheets

(51) Int. Cl.
*H01L 23/522* (2006.01)
*H01L 23/532* (2006.01)

(58) Field of Classification Search
CPC ......... H01L 21/76877; H01L 21/76804; H01L 21/7682; H01L 2221/1047
See application file for complete search history.

(56) References Cited

U.S. PATENT DOCUMENTS

| | | | |
|---|---|---|---|
| 2015/0332963 A1 | 11/2015 | Wu et al. | |
| 2017/0033112 A1* | 2/2017 | Cheng | H10D 1/716 |
| 2020/0075498 A1* | 3/2020 | Kume | H01L 21/31144 |
| 2020/0176312 A1* | 6/2020 | Rabie | H01L 21/31138 |
| 2020/0411415 A1* | 12/2020 | Wu | H01L 21/76832 |
| 2021/0098376 A1* | 4/2021 | Lin | H01L 23/535 |
| 2021/0159378 A1* | 5/2021 | Lee | H10H 20/857 |
| 2022/0051940 A1* | 2/2022 | Lin | H01L 21/76843 |
| 2022/0093769 A1 | 3/2022 | Huang | |
| 2022/0336271 A1 | 10/2022 | Naik et al. | |
| 2023/0012516 A1* | 1/2023 | Hwang | H01L 21/76832 |

OTHER PUBLICATIONS

Office Action mailed on Sep. 12, 2023 related to Taiwanese Application No. 112109849.

\* cited by examiner

SEMICONDUCTOR DEVICE STRUCTURE WITH LINER LAYER HAVING TAPERED SIDEWALL AND METHOD FOR PREPARING THE SAME

TECHNICAL FIELD

The present disclosure relates to a semiconductor device structure and a method for preparing the same, and more particularly, to a semiconductor device structure with a liner layer having a tapered sidewall and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as inadequate step coverage and/or voids. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a spacer structure disposed in the second dielectric layer, and a conductive structure penetrating through the second dielectric layer and extending into the first dielectric layer. The conductive structure is surrounded by the spacer structure. The semiconductor device structure further includes a liner layer separating the conductive structure from the first dielectric layer, the second dielectric layer and the spacer structure. The liner layer has a tapered sidewall in direct contact with the first dielectric layer.

In an embodiment, the spacer structure is in direct contact with a top surface of the first dielectric layer. In an embodiment, an angle between the tapered sidewall and a bottom surface of the liner layer is greater than 90 degrees. In an embodiment, the liner layer is in direct contact with a top surface and a sidewall of the second dielectric layer. In an embodiment, the conductive structure further includes a barrier layer, and a metal filling portion disposed over and surrounded by the barrier layer, wherein the metal filling portion includes copper (Cu).

In an embodiment, a top width of the metal filling portion is greater than a bottom width of the metal filling portion. In an embodiment, the conductive structure further includes a metal layer disposed between the barrier layer and the metal filling portion, wherein the metal layer includes copper-manganese (Cu—Mn) alloy. In an embodiment, the spacer structure further includes an L-shaped liner. In an embodiment, the spacer structure further includes an air gap enclosed by the L-shaped liner and the liner layer.

In another embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a conductive structure penetrating through the second dielectric layer and extending into the first dielectric layer, and a liner layer covering a top surface of the second dielectric layer and surrounding the conductive structure. The liner layer has a tapered sidewall in direct contact with the first dielectric layer. The semiconductor device structure further includes a spacer structure disposed between the liner layer and the second dielectric layer. The spacer structure is in direct contact with a top surface of the first dielectric layer.

In an embodiment, the liner layer is in direct contact with the second dielectric layer, the spacer structure and the conductive structure. In an embodiment, a bottom surface of the liner layer is higher than a bottom surface of the first dielectric layer, and an angle between the tapered sidewall and the bottom surface of the liner layer is greater than 90 degrees. In an embodiment, the conductive structure further includes a metal filling portion, a metal layer surrounding the metal filling portion, and a barrier layer surrounding the metal layer. In an embodiment, a top width of the metal filling portion is greater than a bottom width of the metal filling portion. In an embodiment, the metal filling portion includes copper (Cu), and the metal layer includes copper-manganese (Cu—Mn) alloy.

In an embodiment, the spacer structure further includes an L-shaped liner, and a porous low-k dielectric layer enclosed by the L-shaped liner and the liner layer. In an embodiment, the spacer structure further includes an L-shaped liner, and an energy removable layer enclosed by the L-shaped liner and the liner layer. In an embodiment, the spacer structure further includes an L-shaped liner, and an air gap enclosed by the L-shaped liner and the liner layer.

In yet another embodiment of the present disclosure, a method for preparing a semiconductor device structure is provided. The method includes forming a first dielectric layer over a semiconductor substrate, and forming a second dielectric layer over the first dielectric layer. The method also includes performing a first etching process to form an opening structure. The opening structure has a tapered profile, and the opening structure has a lower opening in the first dielectric layer and an upper opening in the second dielectric layer. The method further includes performing a second etching process to laterally extend the upper opening of the opening structure, such that a top surface of the first dielectric layer is exposed by an enlarged upper opening, and forming a spacer structure over the top surface of the first dielectric layer. In addition, the method includes forming a liner layer covering the spacer structure, and forming a conductive structure over and surrounded by the liner layer.

In an embodiment, a bottom surface of the opening structure is higher than a bottom surface of the first dielectric layer. In an embodiment, an angle between a bottom surface and a sidewall of the opening structure is greater than 90 degrees. In an embodiment, the conductive structure is separated from the first dielectric layer, the second dielectric layer and the spacer structure by the liner layer. In an embodiment, the liner layer covers a top surface of the second dielectric layer. In an embodiment, the step of forming the conductive structure includes forming a barrier layer over the liner layer, and forming a metal layer over the barrier layer. In addition, the step of forming the conductive structure includes forming a metal filling portion over the metal layer, and performing a planarization process to expose the liner layer.

In an embodiment, the step of forming the spacer structure includes forming a liner material lining the lower opening and the enlarged upper opening, and forming a porous low-k dielectric layer over the liner material. In addition, the step of forming the spacer structure includes performing a third etching process to partially remove the liner material and the porous low-k dielectric layer, such that a sidewall of the enlarged upper opening, and a sidewall and a bottom surface of the lower opening are exposed. In an embodiment, the step of forming the spacer structure includes forming a liner material lining the lower opening and the enlarged upper opening, and forming an energy removable layer over the liner material. In addition, the step of forming the spacer structure includes performing a third etching process to partially remove the liner material and the energy removable layer, such that a sidewall of the enlarged upper opening, and a sidewall and a bottom surface of the lower opening are exposed. In an embodiment, the method further includes performing a heat treatment process to transform the energy removable layer into an air gap. In an embodiment, the heat treatment process is performed after the conductive structure is formed.

Embodiments of a semiconductor device structure and method for preparing the same are provided in the disclosure. In some embodiments, the semiconductor device structure includes a first dielectric layer and a second dielectric layer disposed over the first dielectric layer, and a conductive structure penetrating through the second dielectric layer and extending into the first dielectric layer. In some embodiments, the conductive structure is separated from the first dielectric layer by a liner layer, and the liner layer has a tapered sidewall in direct contact with the first dielectric layer, which helps to improve the step coverage of the liner layer and the overlying conductive structure. Moreover, adequate step coverage of the conductive structure can reduce electromigration (EM). As a result, performance and reliability of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
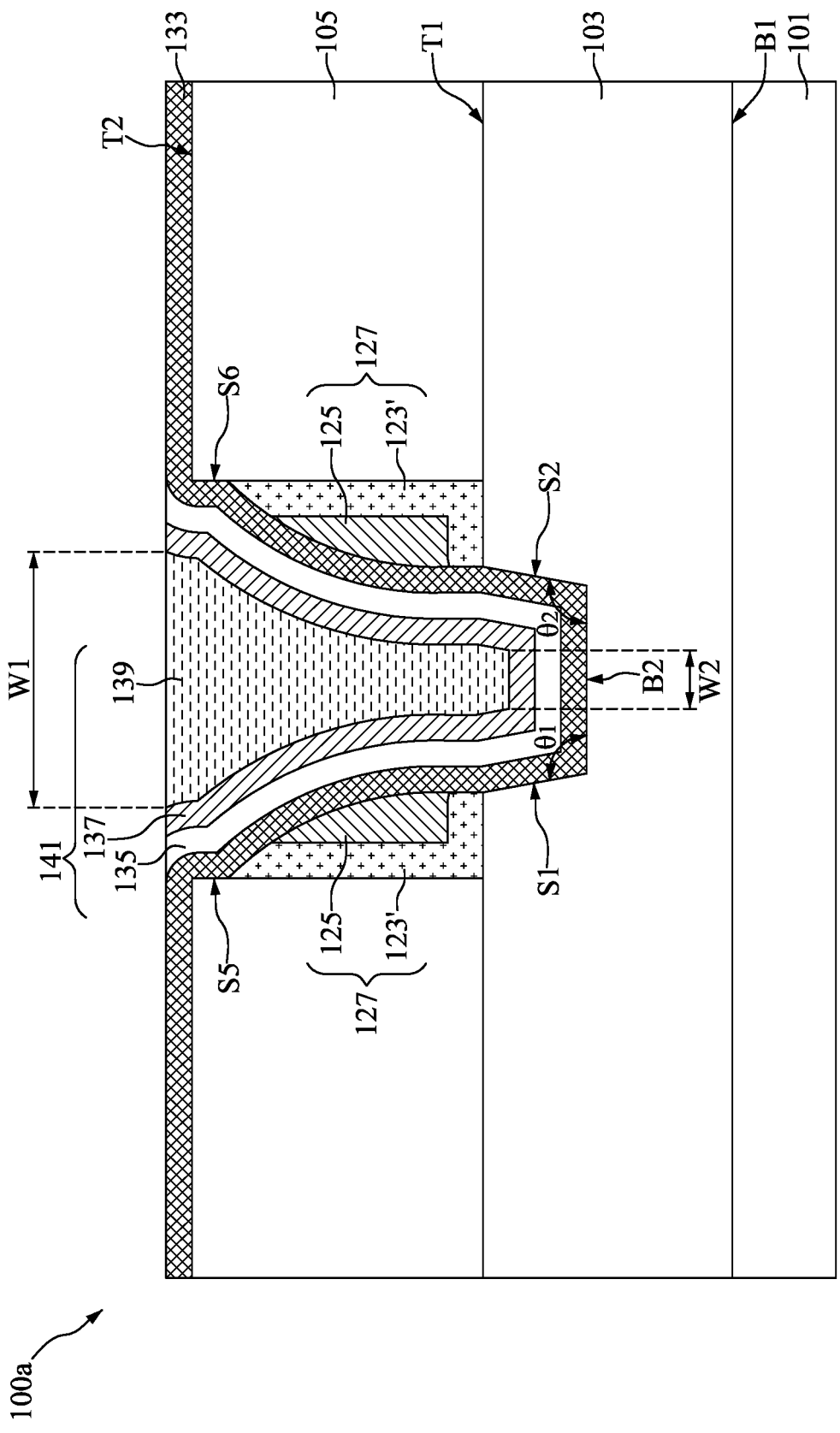
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100a, in accordance with some embodiments. As shown in FIG. 1, the semiconductor device structure 100a includes a semiconductor substrate 101, a first dielectric layer 103 disposed over the semiconductor substrate 101, and a second dielectric layer 105 disposed over the first dielectric layer 103, in accordance with some embodiments.

In some embodiments, the semiconductor device structure 100a also includes a spacer structure 127 disposed in the second dielectric layer 105. In some embodiments, the spacer structure 127 is disposed over and in direct contact with the top surface T1 of the first dielectric layer 103. In some embodiments, the spacer structure 127 includes an L-shaped liner 123' and a porous low-k dielectric layer 125 disposed over the L-shaped liner 123'.

In some embodiments, the semiconductor device structure 100a further includes a liner layer 133 covering the spacer structure 127. In some embodiments, the liner layer 133 is disposed over the second dielectric layer 105 and extending into the second dielectric layer 105 and the first dielectric layer 103. In some embodiments, the liner layer 133 is in direct contact with the top surface T2 and the sidewalls S5 and S6 of the second dielectric layer 105. In addition, the liner layer 133 is in direct contact with the spacer structure 127 and the first dielectric layer 103, in accordance with some embodiments. As shown in FIG. 1, the bottom surface B2 of the liner layer 133 is lower than the top surface T1 of the first dielectric layer, and higher than the bottom surface B1 of the first dielectric layer 103, in accordance with some embodiments.

Moreover, the liner layer 133 has tapered sidewalls S1 and S2 in direct contact with the first dielectric layer 103, in accordance with some embodiments. As shown in FIG. 1, the liner layer 133 has an angle $\theta_1$ between the sidewall S1 and the bottom surface B2, and another angle $\theta_2$ between the sidewall S2 and the bottom surface B2. In some embodiments, each of the angles $\theta_1$ and $\theta_2$ is greater than 90 degrees. In some embodiments, the porous low-k dielectric layer 125 is enclosed by the liner layer 133 and the L-shaped liner 123' of the spacer structure 127.

In some embodiments, the semiconductor device structure 100a includes a conductive structure 141 disposed over and surrounded by the liner layer 133. In some embodiments, the conductive structure 141 includes a barrier layer 135, a metal layer 137 disposed over and surrounded by the barrier layer 135, and a metal filling portion 139 disposed over and surrounded by the metal layer 137. In some embodiments, the conductive structure 141 is surrounded by the spacer structure 127.

Still referring to FIG. 1, the metal filling portion 139 of the conductive structure 141 has a tapered profile with a bottom portion of the metal filling portion 139 being narrower than a respective top portion of the metal filling portion 139, in accordance with some embodiments. For example, the metal filling portion 139 has a top width W1 and a bottom width W2, and the top width W1 is greater than the bottom width W2. In some embodiments, the conductive structure 141 has a tapered profile with a bottom portion of the conductive structure 141 being narrower than a respective top portion of the conductive structure 141.

Moreover, in some embodiments, the conductive structure 141 penetrates through the second dielectric layer 105 and extends into an upper portion of the first dielectric layer 103. In some embodiments, the conductive structure 141 is separated from the first dielectric layer 103, the second dielectric layer 105, and the spacer structure 127 by the liner layer 133. In some embodiments, the metal layer 137 of the conductive structure 141 includes copper-manganese (Cu—Mn) alloy, and the metal filling portion 139 of the conductive structure 141 includes copper (Cu).

Figure 2:
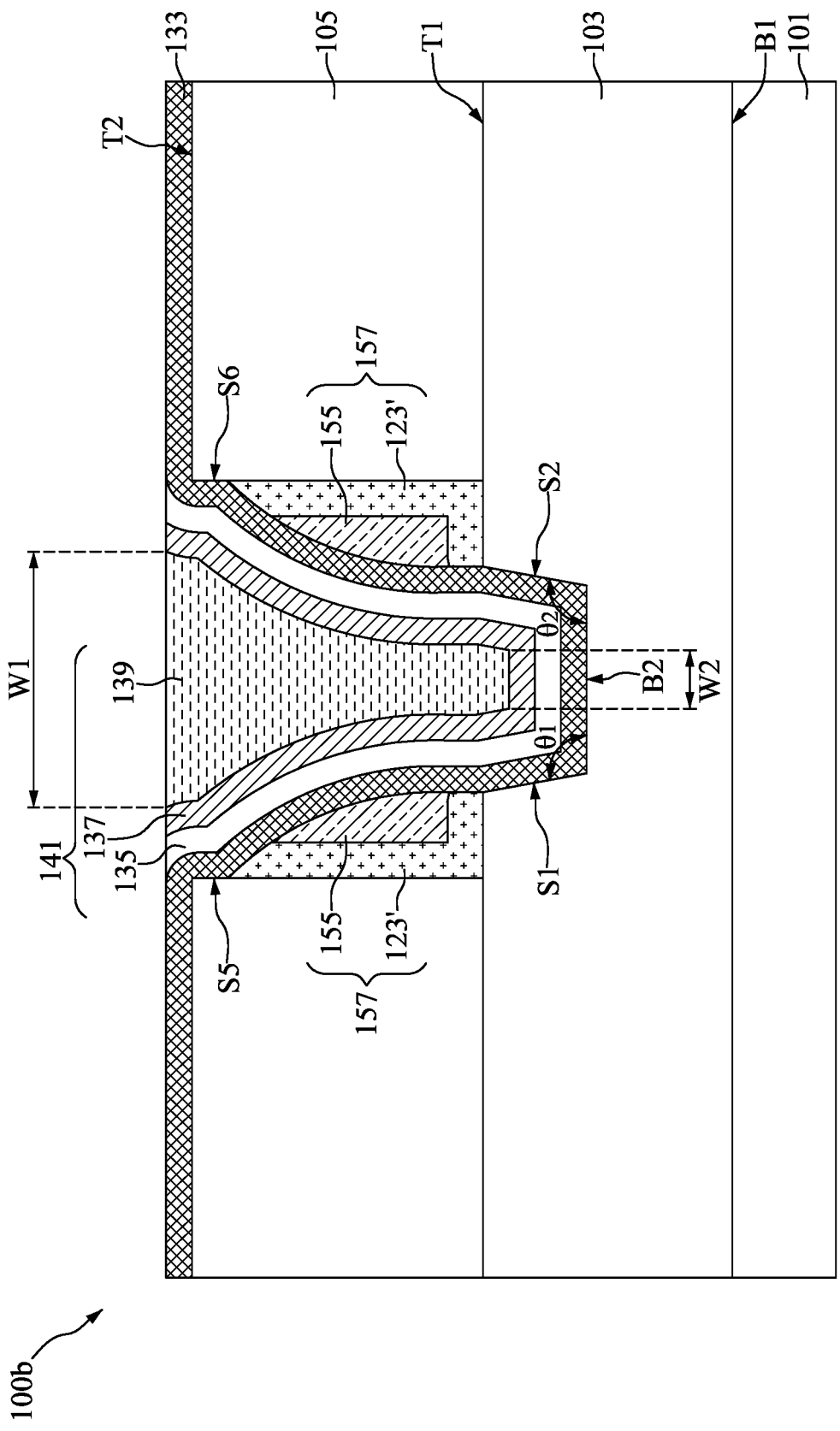
FIG. 2 is a cross-sectional view illustrating a semiconductor device structure, in accordance with some other embodiments.

FIG. 2 is a cross-sectional view illustrating a semiconductor device structure 100b, in accordance with some other embodiments. The semiconductor device structure 100b is similar to the semiconductor device structure 100a. However, in the semiconductor device structure 100b, the porous low-k dielectric layer 125 is replaced by an energy removable layer 155, and a spacer structure 157 including the L-shaped liner 123' and the energy removable layer 155 is obtained, in accordance with some embodiments.

In some embodiments, the energy removable layer 155 of the spacer structure 157 is enclosed by the liner layer 133 and the L-shaped liner 123' of the spacer structure 157. Details regarding this embodiment that are similar to those for the previously described embodiment will not be repeated herein.

Figure 3:
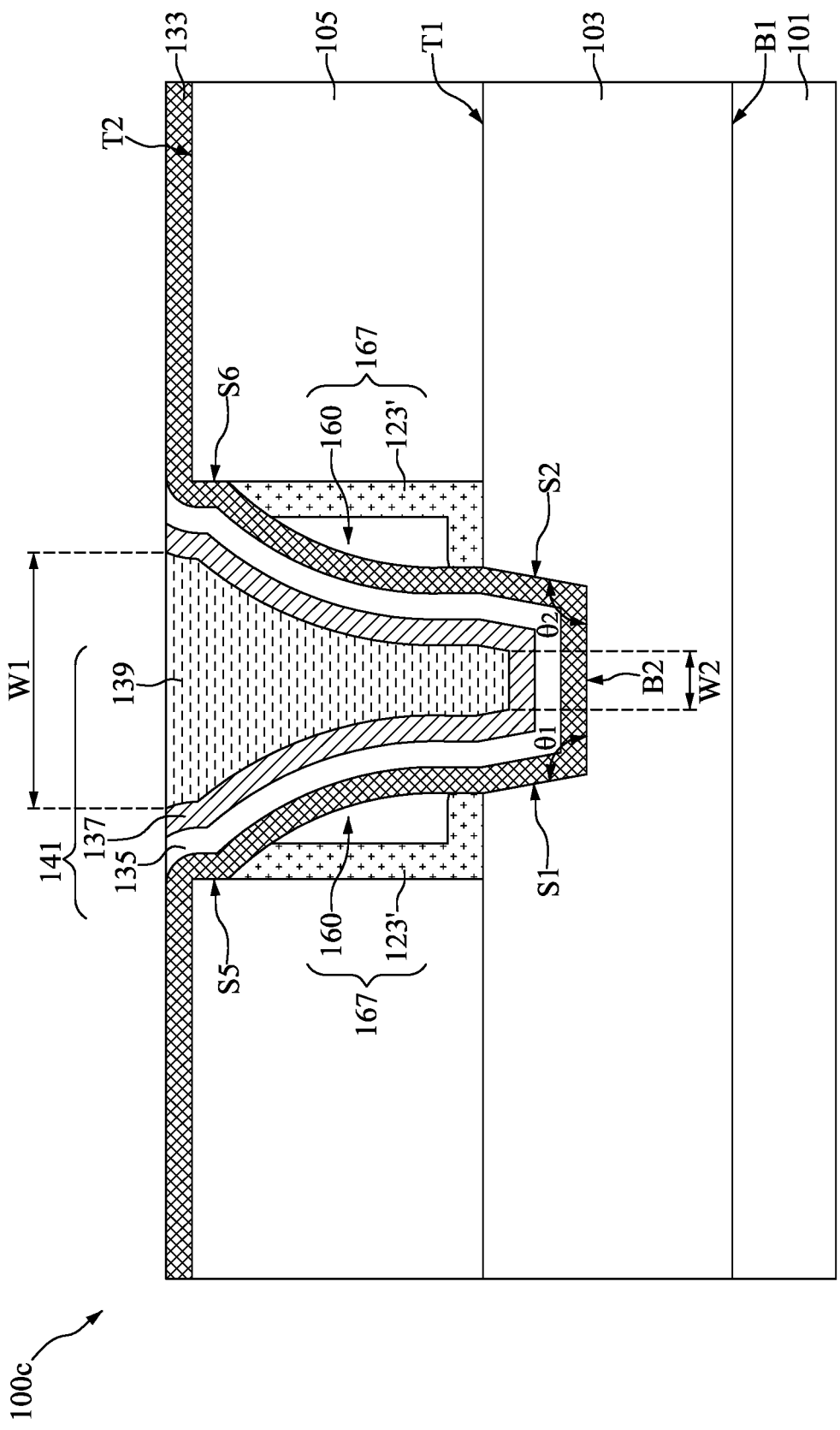
FIG. 3 is a cross-sectional view illustrating a semiconductor device structure, in accordance with some other embodiments.

FIG. 3 is a cross-sectional view illustrating a semiconductor device structure 100c, in accordance with some other embodiments.

The semiconductor device structure 100c is similar to the semiconductor device structure 100b. However, in the semiconductor device structure 100c, the energy removable layer 155 is replaced by an air gap 160, and a spacer structure 167 including the L-shaped liner 123' and the air gap 160 is obtained, in accordance with some embodiments.

In some embodiments, the semiconductor device structure 100c is formed by performing a heat treatment process to the semiconductor device structure 100b, and the energy removable layer 155 is transformed into the air gap 160 during the heat treatment process. In some embodiments, the air gap 160 of the spacer structure 167 is enclosed by the liner layer 133 and the L-shaped liner 123' of the spacer structure 167. Details regarding this embodiment that are similar to those for the previously described embodiment will not be repeated herein.

Figure 4:
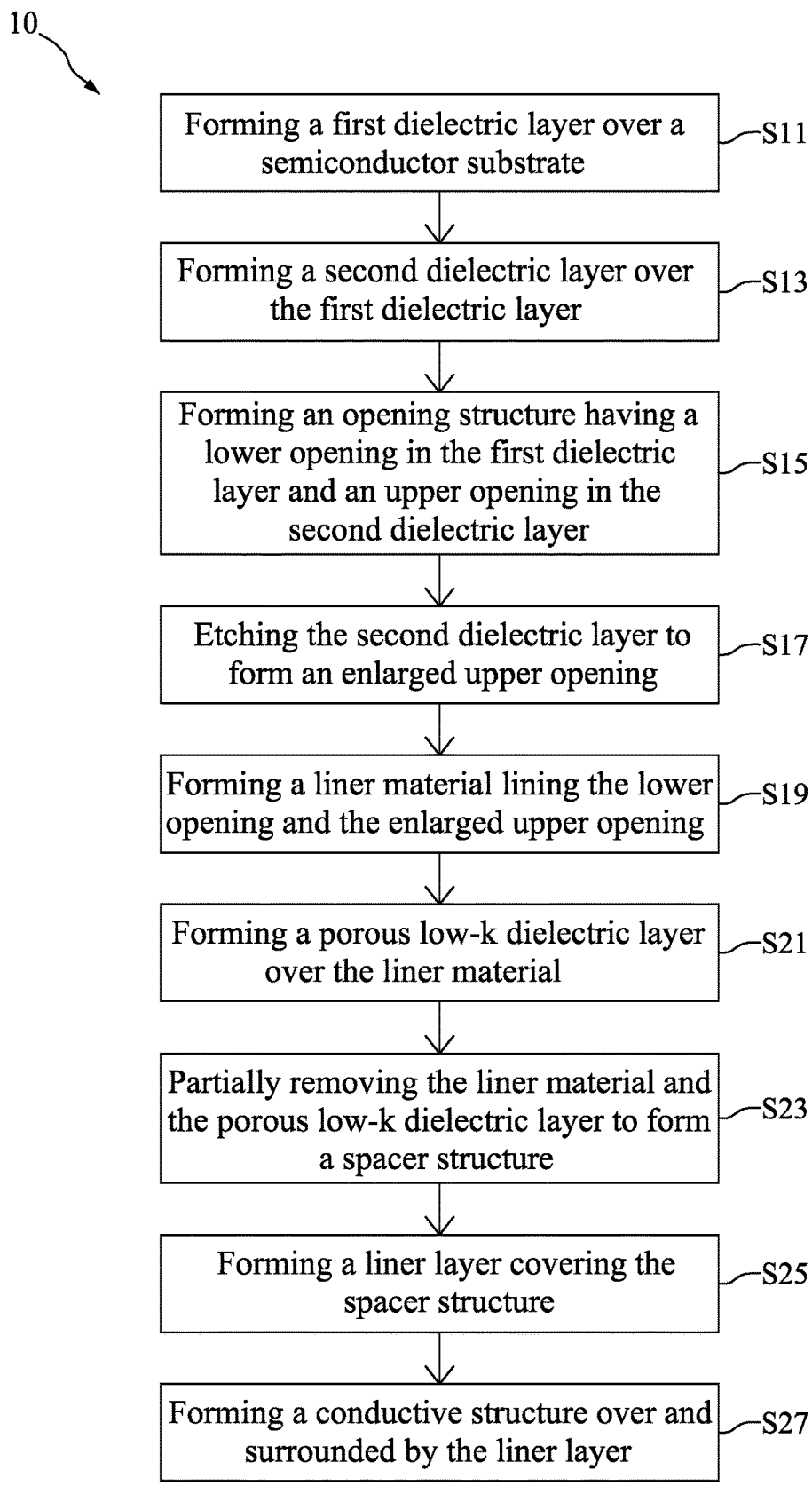
FIG. 4 is a flow diagram illustrating a method for preparing a semiconductor device structure, in accordance with some embodiments.

FIG. 4 is a flow diagram illustrating a method 10 for preparing the semiconductor device structure 100a, and the method 10 includes steps S11, S13, S15, S17, S19, S21, S23, S25 and S27, in accordance with some embodiments. The steps S11 to S27 of FIG. 4 are elaborated in connection with the following figures, such as FIGS. 6-18.

Figure 5:
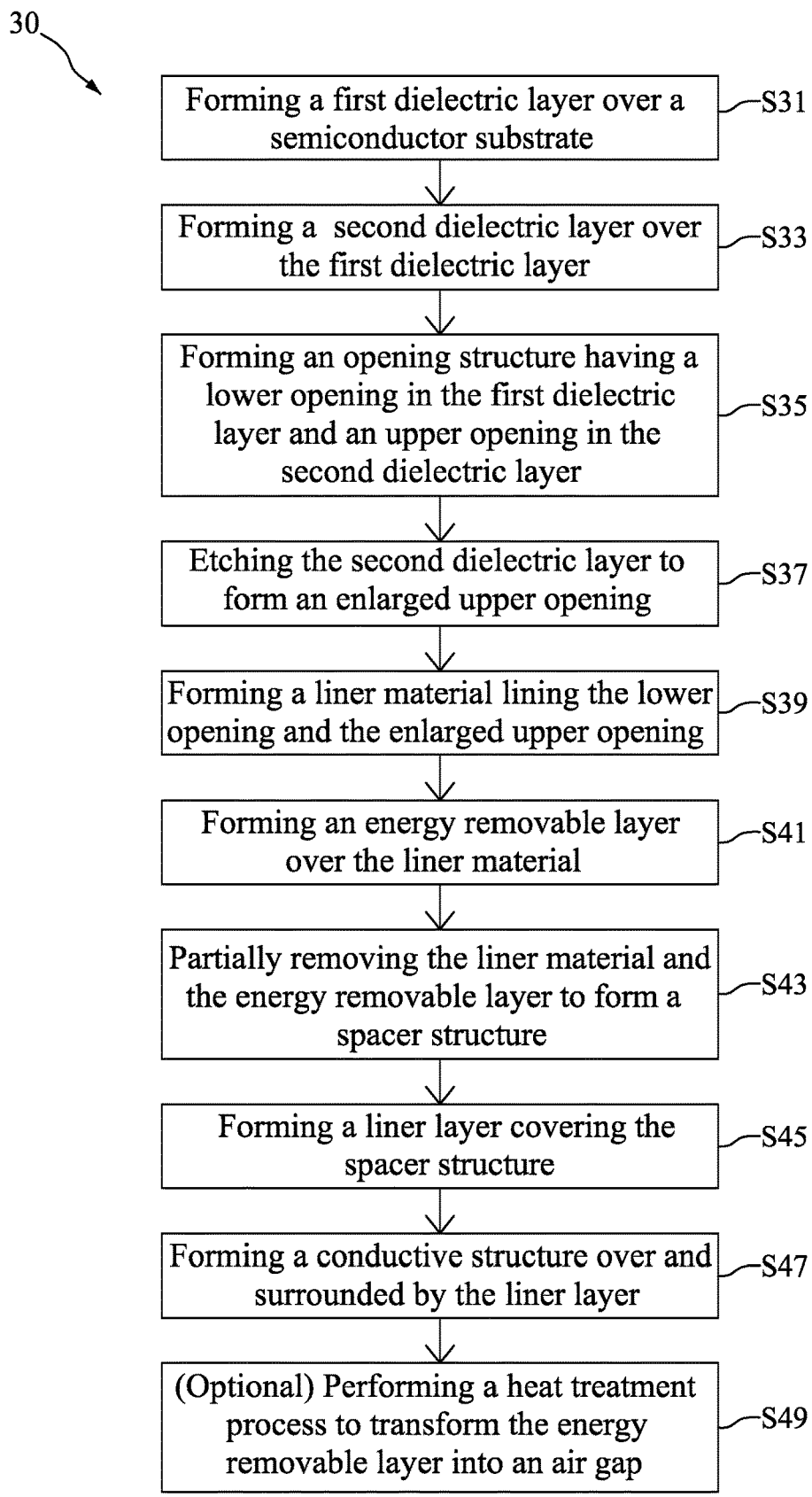
FIG. 5 is a flow diagram illustrating a method for preparing a semiconductor device structure, in accordance with some other embodiments.

FIG. 5 is a flow diagram illustrating a method 30 for preparing the semiconductor device structures 100b and 100c, and the method 30 includes steps S31, S33, S35, S37, S39, S41, S43, S45, S47 and S49, in accordance with some embodiments. The steps S31 to S49 of FIG. 5 are elaborated in connection with the following figures, such as FIGS. 19 and 20. The step S49 of performing a heat treatment process is optional. In the embodiments for forming the semiconductor device structure 100b, the structure of the semiconductor device structure 100b shown in FIG. 2 is obtained after the step S47, and the step S49 may be omitted. In the embodiments for forming the semiconductor device structure 100c, the structure of the semiconductor device structure 100c shown in FIG. 3 is obtained after the step S49.

Figure 6:
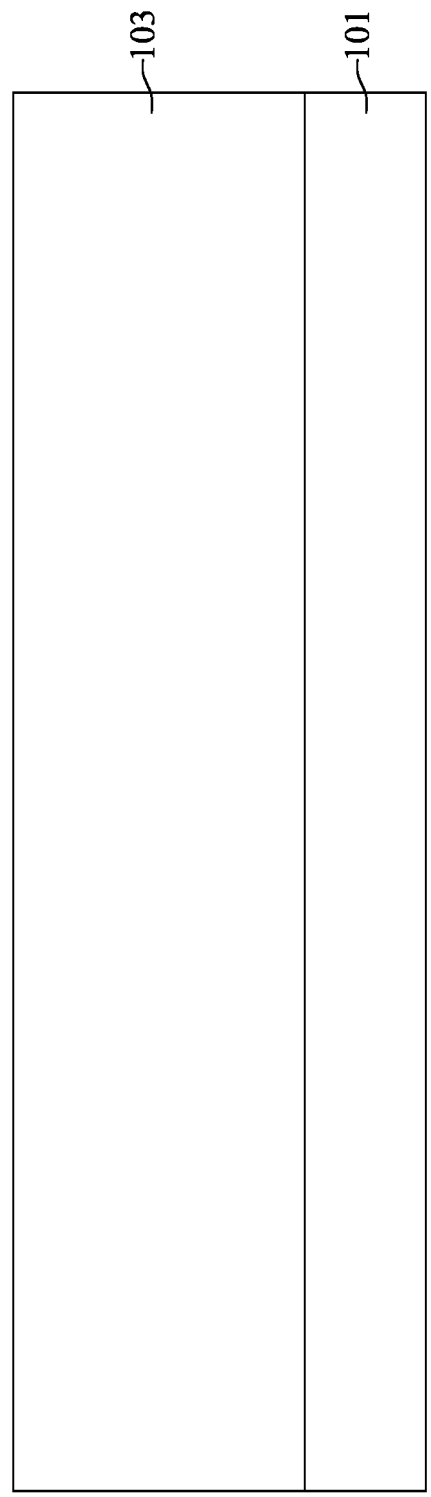
FIG. 6 is a cross-sectional view illustrating an intermediate stage of forming a first dielectric layer over a semiconductor substrate during the formation of the semiconductor device structure, in accordance with some embodiments.

FIGS. 6-18 are cross-sectional views illustrating intermediate stages of forming the semiconductor device structure 100a, in accordance with some embodiments. As shown in FIG. 6, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 103 is formed over the semiconductor substrate 101, as shown in FIG. 6 in accordance with some embodiments. The respective step is illustrated as the step S11 in the method 10 shown in FIG. 4. In some embodiments, the first dielectric layer 103 is made of silicon oxide, silicon nitride, silicon oxynitride, a low-k dielectric material or another suitable material. The first dielectric layer 103 may be formed by a deposition process, such as a chemical vapor deposition (CVD) process, a physical vapor deposition (PVD) process, an atomic layer deposition (ALD) process, a spin-on coating process, or another suitable method.

Figure 7:
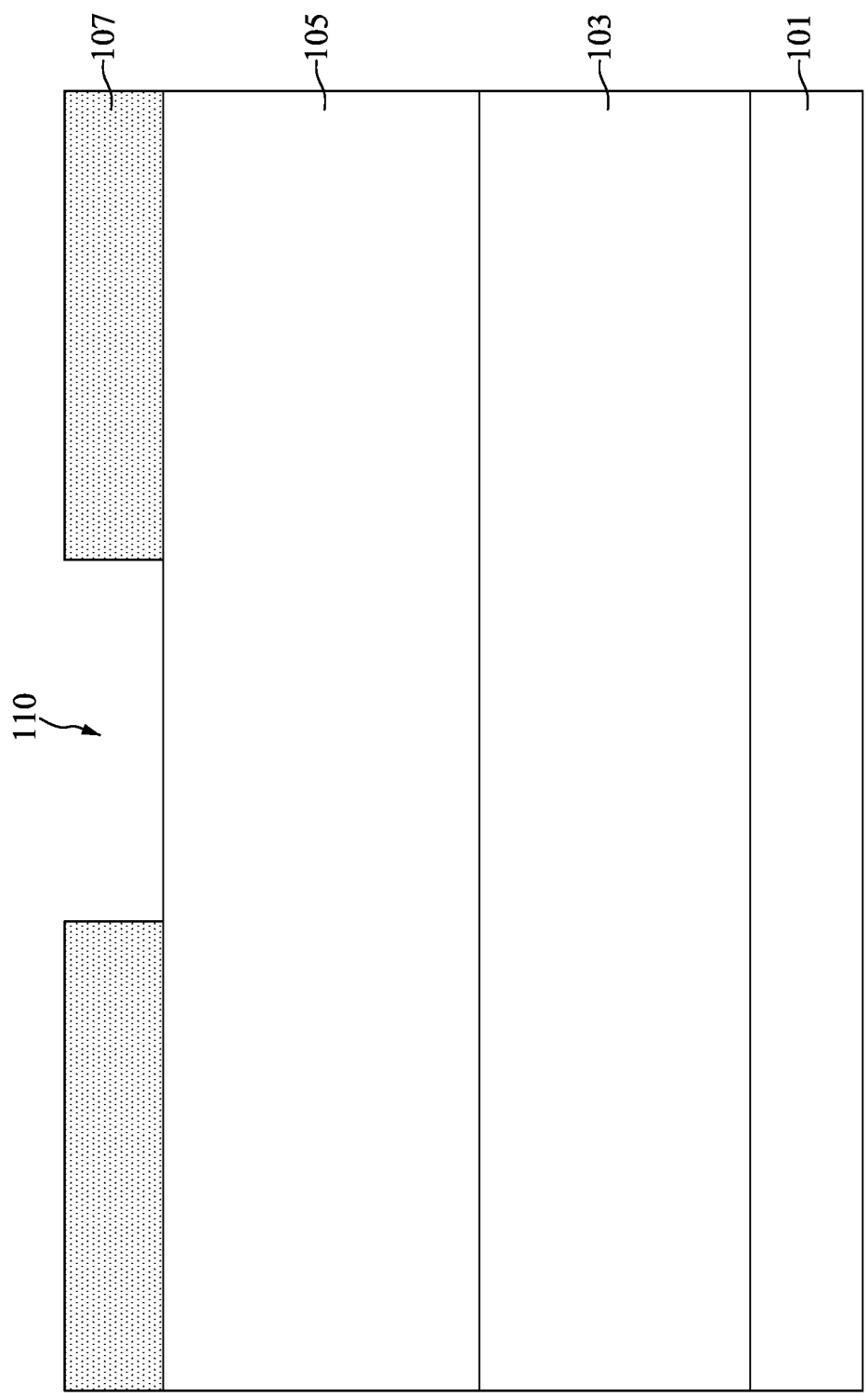
FIG. 7 is a cross-sectional view illustrating an intermediate stage of sequentially forming a second dielectric layer and a patterned mask over the first dielectric layer during the formation of the semiconductor device structure, in accordance with some embodiments.

Next, a second dielectric layer 105 is formed over the first dielectric layer 103, as shown in FIG. 7 in accordance with some embodiments. Some materials and processes used to form the second dielectric layer 105 are similar to, or the same as, those used to form the first dielectric layer 103, and details thereof are not repeated herein. The respective step is illustrated as the step S13 in the method 10 shown in FIG. 4.

Still referring to FIG. 7, a patterned mask 107 with an opening 110 is formed over the second dielectric layer 105, in accordance with some embodiments. In some embodiments, the second dielectric layer 105 is partially exposed by the opening 110. In some embodiments, the second dielectric layer 105 and the patterned mask 107 include different materials so that the etching selectivities may be different in the subsequent etching process.

Figure 8:
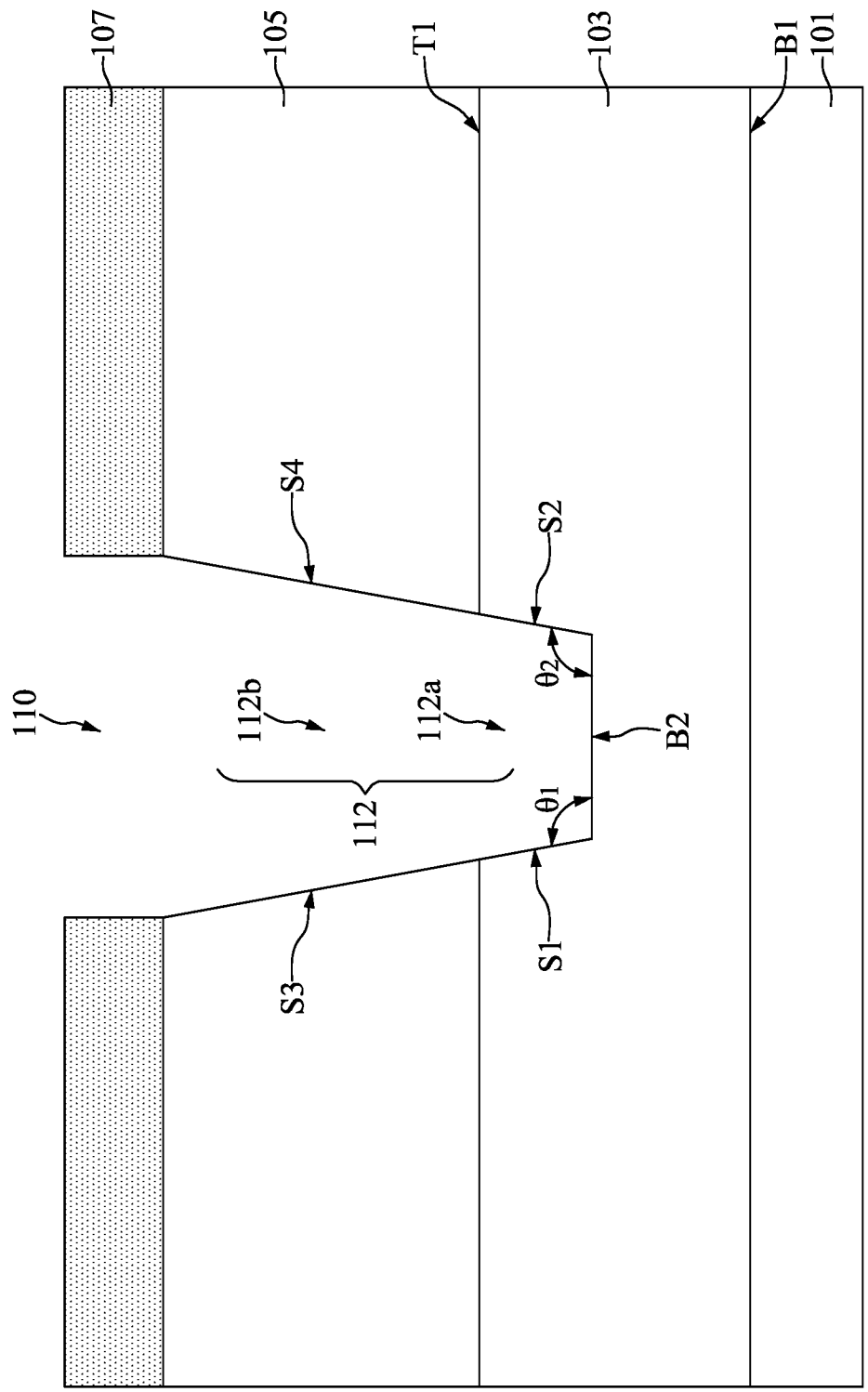
FIG. 8 is a cross-sectional view illustrating an intermediate stage of forming an opening structure in the first dielectric layer and the second dielectric layer using the patterned mask as a mask during the formation of the semiconductor device structure, in accordance with some embodiments.

Subsequently, an etching process (also referred to as a first etching process) is performed using the patterned mask 107 as a mask, such that an opening structure 112 is formed in the first dielectric layer 103 and the second dielectric layer 105, as shown in FIG. 8 in accordance with some embodiments. In some embodiments, the opening structure 112 includes a lower opening 112a in the first dielectric layer 103 and an upper opening 112b in the second dielectric layer 105. The respective step is illustrated as the step S15 in the method 10 shown in FIG. 4. In some embodiments, the first etching process includes a wet etching process, a dry etching process, or a combination thereof.

In some embodiments, the opening structure 112 penetrates through the second dielectric layer 105 and extending into an upper portion of the first dielectric layer 103. In other words, the opening structure 112 stops at an intermediate level of the first dielectric layer 103. For example, the bottom surface B2 of the opening structure 112 is located between the top surface T1 and the bottom surface B1 of the first dielectric layer 103, as shown in FIG. 8 in accordance with some embodiments.

Moreover, the opening structure 112 has a tapered profile with a bottom portion of the opening structure 112 being narrower than a respective top portion of the opening structure 112, in accordance with some embodiments. In some embodiments, the opening structure 112 has tapered sidewalls, such as the sidewalls S1 and S2 in the first dielectric layer 103, and the sidewalls S3 and S4 in the second dielectric layer 105. In some embodiments, the sidewall S1 is aligned with the sidewall S3, and an angle $\theta_1$ between the sidewall S1 and the bottom surface B2 of the opening structure 112 is greater than 90 degrees. In some embodiments, the sidewall S2 is aligned with the sidewall S4, and an angle $\theta_2$ between the sidewall S2 and the bottom surface B2 of the opening structure 112 is greater than 90 degrees.

Figure 9:
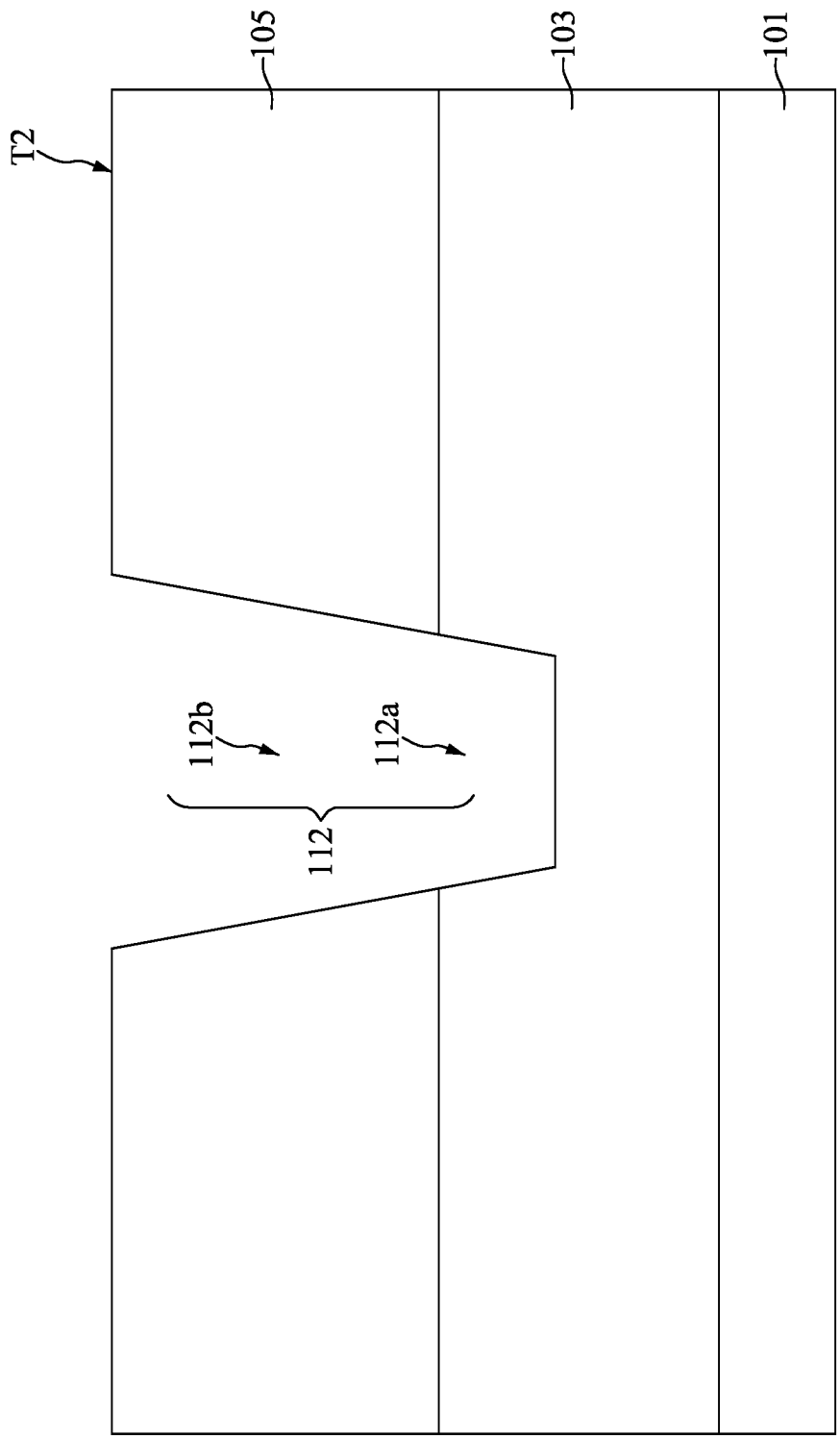
FIG. 9 is a cross-sectional view illustrating an intermediate stage of removing the patterned mask during the formation of the semiconductor device structure, in accordance with some embodiments.

Then, the patterned mask 107 is removed, as shown in FIG. 9 in accordance with some embodiments. In some embodiments, the patterned mask 107 is removed by a stripping process, an ashing process, an etching process, or another suitable process. After the patterned mask 107 is removed, the top surface T2 of the second dielectric layer 105 is exposed.

Figure 10:
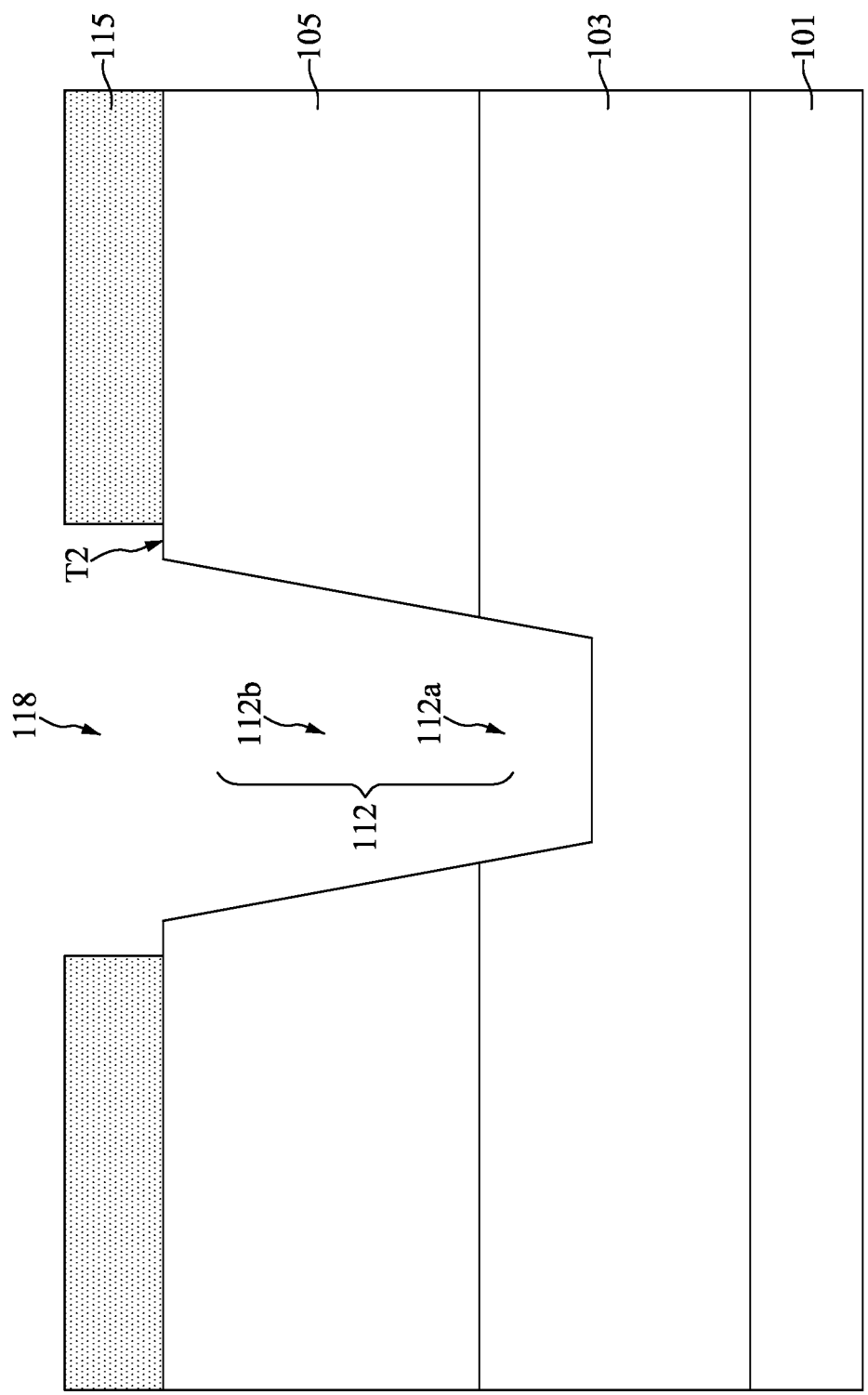
FIG. 10 is a cross-sectional view illustrating an intermediate stage of forming a patterned mask over the second dielectric layer during the formation of the semiconductor device structure, in accordance with some embodiments.

Next, a patterned mask 115 with an opening 118 is formed over the second dielectric layer 105, as shown in FIG. 10 in accordance with some embodiments. In some embodiments, the portions of the top surface T2 of the second dielectric layer 105 close to the opening structure 112 is exposed by the opening 118 of the patterned mask 115. In some embodiments, the second dielectric layer 105 and the patterned mask 115 include different materials so that the etching selectivities may be different in the subsequent etching process.

Figure 11:
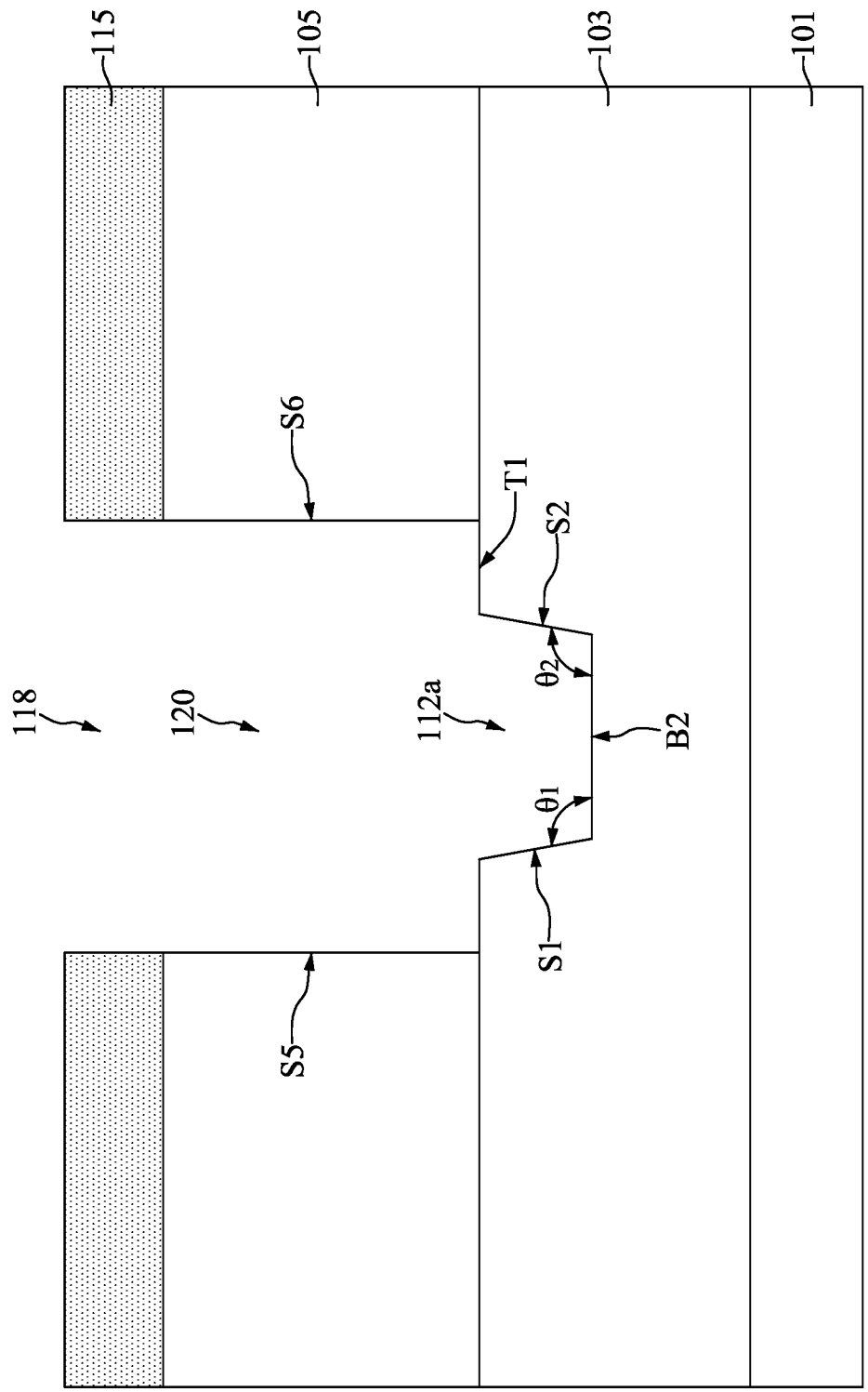
FIG. 11 is a cross-sectional view illustrating an intermediate stage of etching the second dielectric layer to form an enlarged upper opening in the opening structure during the formation of the semiconductor device structure, in accordance with some embodiments.

Subsequently, an etching process (also referred to as a second etching process) is performed using the patterned mask 115 as a mask, such that an enlarged upper opening 120 is formed in the second dielectric layer 105, as shown in FIG. 11 in accordance with some embodiments. In some embodiments, the upper opening 112b of the opening structure 112 (see FIG. 10) is laterally extended by the second etching process. As a result, sidewalls S5 and S6 of the enlarged upper opening 120 are obtained, and the top surface T1 of the first dielectric layer 103 is partially exposed by the enlarged upper opening 120. The respective step is illustrated as the step S17 in the method 10 shown in FIG. 4.

In some embodiments, the lower opening 112a of the original opening structure 112 substantially remains intact during the second etching process. Within the context of this disclosure, the word "substantially" means preferably at least 90%, more preferably 95%, even more preferably 98%, and most preferably 99%. In some embodiments, after the second etching process is performed, both of the angle $\theta_1$ and the angle $\theta_2$ are greater than 90 degrees. After the enlarged upper opening 120 is formed, the patterned mask 115 may be removed.

Figure 12:
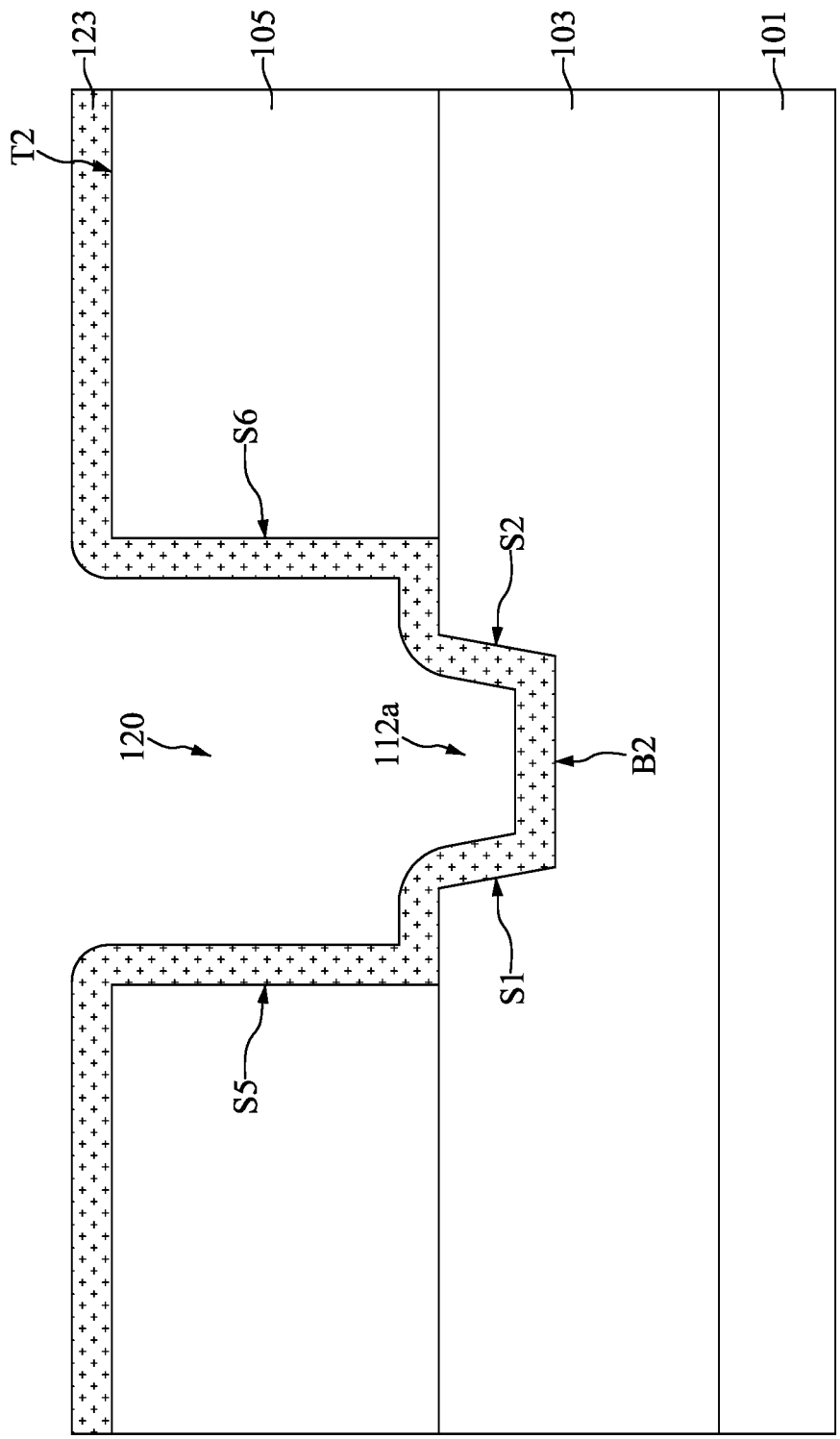
FIG. 12 is a cross-sectional view illustrating an intermediate stage of forming a liner material lining the enlarged upper opening and a lower opening of the opening structure during the formation of the semiconductor device structure, in accordance with some embodiments.

Then, a liner material 123 is formed lining the lower opening 112a and the enlarged upper opening 120, as shown in FIG. 12 in accordance with some embodiments. The respective step is illustrated as the step S19 in the method 10 shown in FIG. 4. In some embodiments, the liner material 123 is conformally formed over the structure of FIG. 11 after the patterned mask 115 is removed.

In some embodiments, the liner material 123 is formed lining the bottom surface B2 and the sidewalls S1, S2 of the lower opening 112a, and lining the sidewalls S5, S6 of the enlarged upper opening 120. In some embodiments, the portions of the top surface T1 of the first dielectric layer 103 exposed by the enlarged upper opening 120 are covered by and in direct contact with the liner material 123. In some embodiments, the liner material 123 further extends to cover the top surface T2 of the second dielectric layer 105.

Moreover, in some embodiments, the liner material 123 is made of a dielectric material, such as silicon nitride, a silicon nitride-based material (e.g., SiON, SiCN or SiOCN), or another suitable dielectric material. In some embodiments, the liner material 123 is formed by a deposition process, such as a CVD process, a PVD process, an ALD process, or another suitable method.

Figure 13:
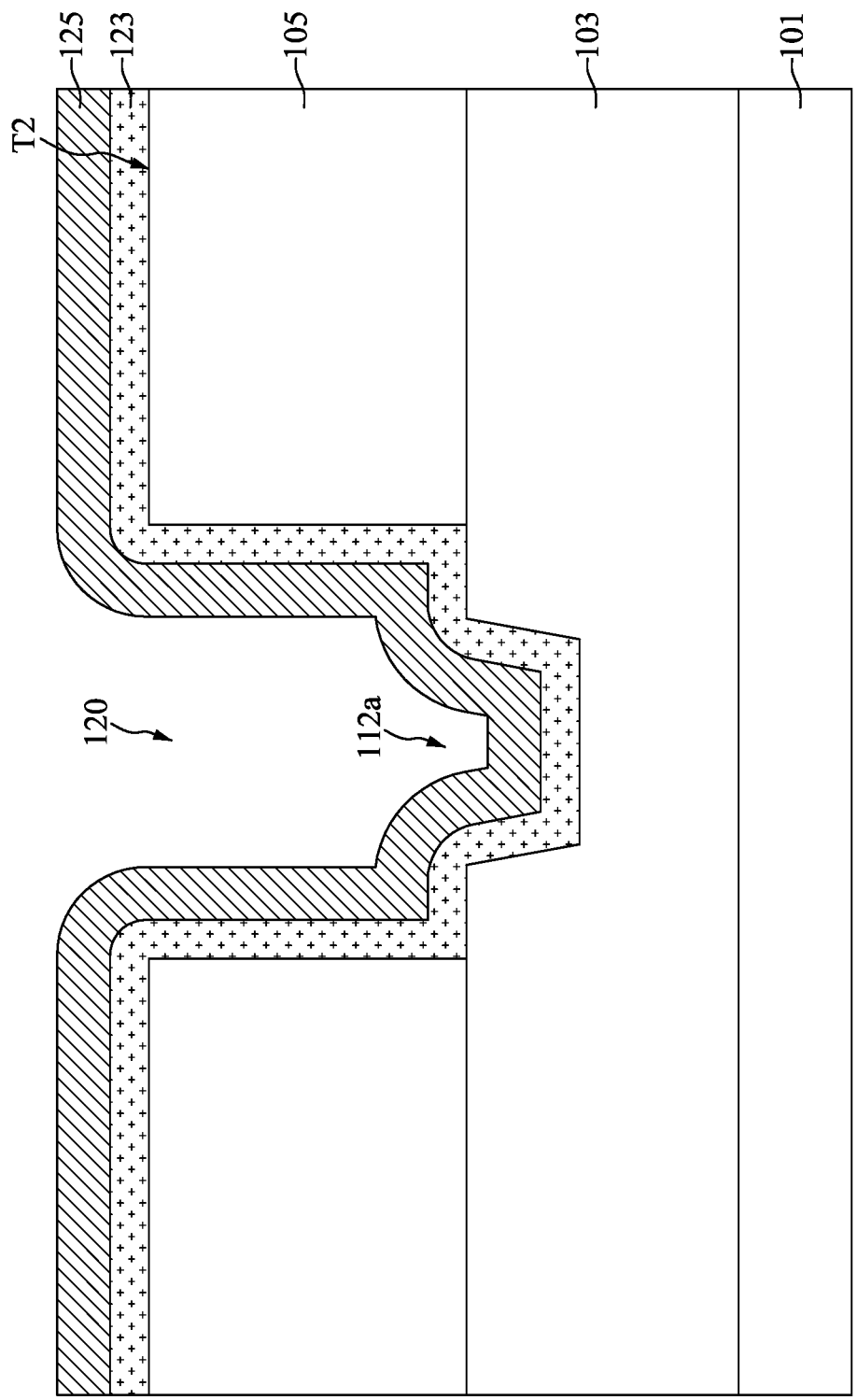
FIG. 13 is a cross-sectional view illustrating an intermediate stage of forming a porous low-k dielectric layer over the liner material during the formation of the semiconductor device structure, in accordance with some embodiments.

Next, a porous low-k dielectric layer 125 is formed over the liner material 123, as shown in FIG. 13 in accordance with some embodiments. The respective step is illustrated as the step S21 in the method 10 shown in FIG. 4. In some embodiments, the porous low-k dielectric layer 125 is conformally formed over the structure of FIG. 12.

In some embodiments, the porous low-k dielectric layer 125 is made of silicon oxide, silicon nitride, silicon oxynitride, or another suitable low-k material. The dielectric constants (k values) of the low-k dielectric materials may be lower than about 3.0, for example. In some embodiments, the porous low-k dielectric layer 125 is formed by a deposition process, such as a CVD process, a PVD process, an ALD process, or another suitable method.

Figure 14:
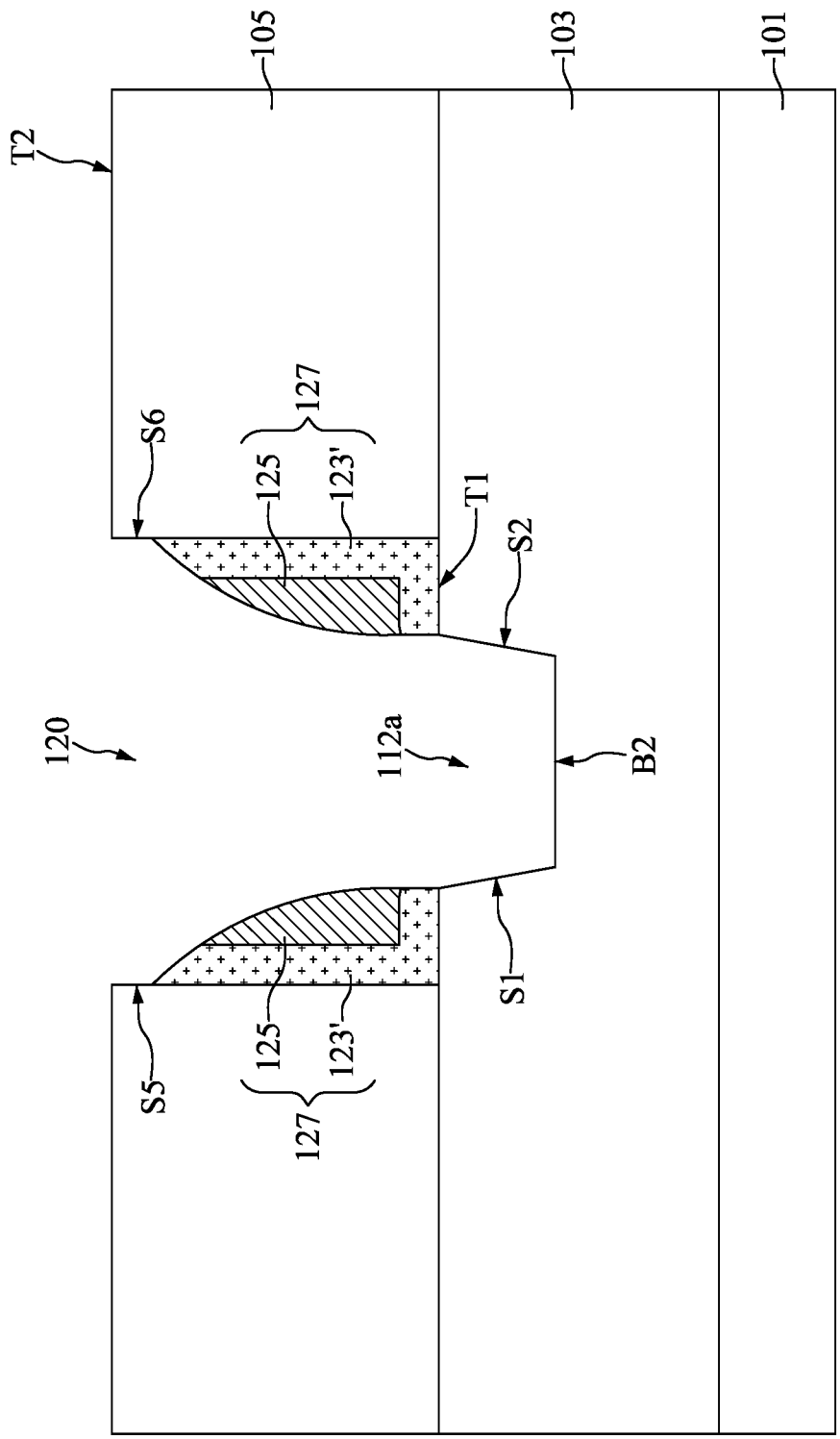
FIG. 14 is a cross-sectional view illustrating an intermediate stage of etching the porous low-k dielectric layer and the liner material to form a spacer structure during the formation of the semiconductor device structure, in accordance with some embodiments.

Subsequently, an etching process (also referred to as a third etching process) is performed to partially remove the liner material 123 and the porous low-k dielectric layer 125, such that a spacer structure 127 including the remaining portions of the liner material 123 and the porous low-k dielectric layer 125 is obtained, as shown in FIG. 14 in accordance with some embodiments. The respective step is illustrated as the step S23 in the method 10 shown in FIG. 4. In some embodiments, the remaining portion of the liner material 123 has an "L" shape, which is referred to as an L-shaped liner 123'.

In some embodiments, after the third etching process is performed, the sidewalls S5 and S6 of the enlarged upper opening 120 are partially exposed by the spacer structure 127, and the sidewalls S1, S2 and the bottom surface B2 of the lower opening 112a are exposed. In some embodiments, the exposed portions of the sidewalls S5 and S6 are above the spacer structure 127. In some embodiments, the top surface T2 of the second dielectric layer 105 is exposed after the spacer structure 127 is formed.

In some embodiments, the liner material 123 and the porous low-k dielectric layer 125 are etched by an anisotropic etching process, which removes the same amount of the liner material 123 and the porous low-k dielectric layer 125 vertically in all places, leaving the spacer structure 127 on the lower portions of the sidewalls S5 and S6 of the second dielectric layer 105. In some embodiments, the third etching process is a dry etching process, such as plasma etching, reactive ion etching (RIE), neutral beam etching (NBE), or the like.

Figure 15:
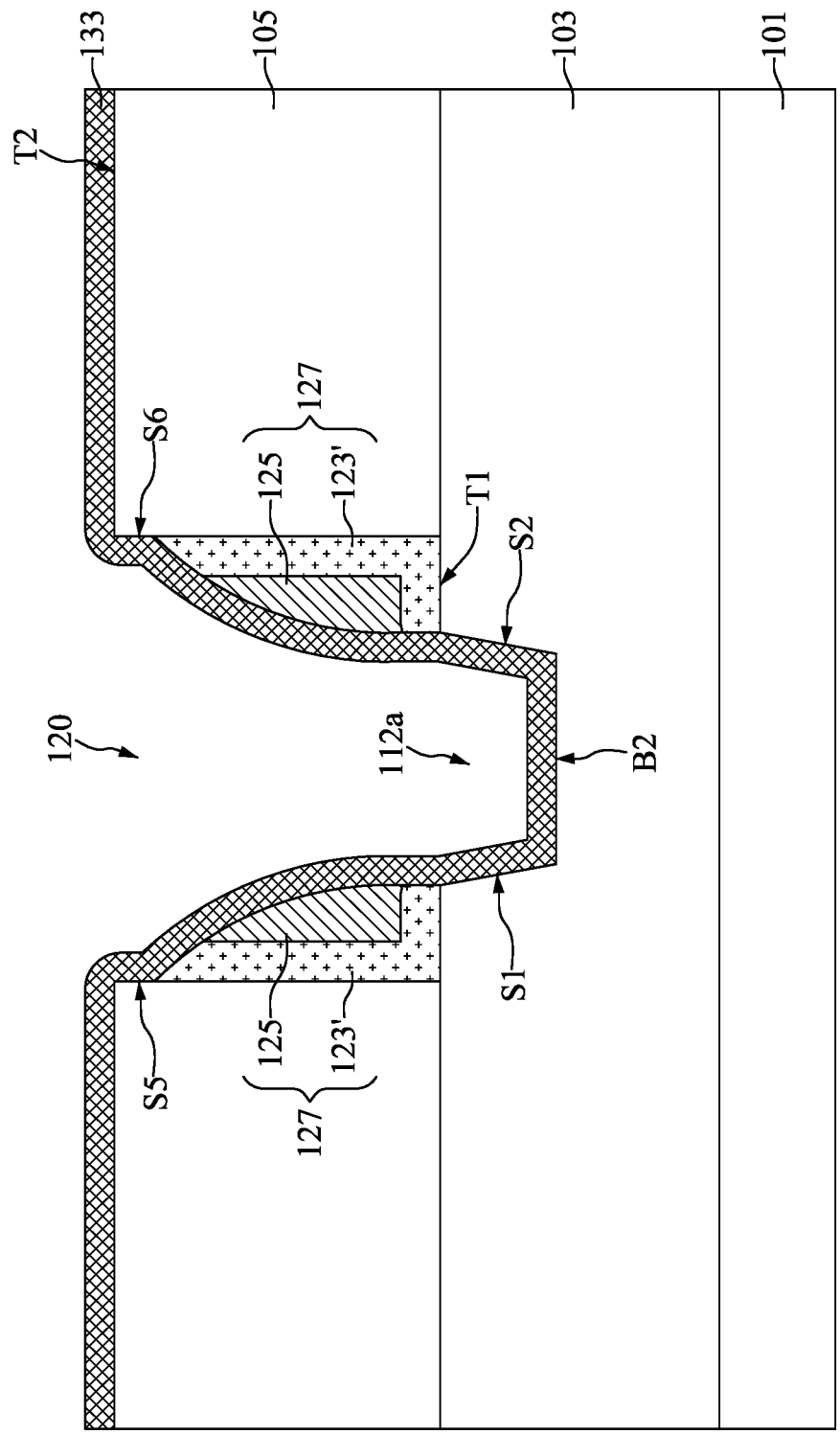
FIG. 15 is a cross-sectional view illustrating an intermediate stage of forming a liner layer over the second dielectric layer, covering the spacer structure, and lining the exposed surface(s) of the opening structure during the formation of the semiconductor device structure, in accordance with some embodiments.

Then, a liner layer 133 is conformally formed over the structure of FIG. 14, and the spacer structure 127 is covered by the liner layer 133, as shown in FIG. 15 in accordance with some embodiments. The respective step is illustrated as the step S25 in the method 10 shown in FIG. 4. In some embodiments, the liner layer 133 is formed lining the bottom surface B2 and the sidewalls S1, S2 of the lower opening 112a.

In some embodiments, the liner layer 133 is formed covering the spacer structure 127 and the portions of the sidewalls S5, S6 exposed by the spacer structure 127. In some embodiments, the liner layer 133 further extends to cover the top surface T2 of the second dielectric layer 105. In some embodiments, the porous low-k dielectric layer 125 of the spacer structure 127 is enclosed by the L-shaped liner 123' and the liner layer 133.

In some embodiments, the liner layer 133 is made of a dielectric material, such as silicon nitride, a silicon nitride-based material (e.g., SiON, SiCN or SiOCN), or another suitable dielectric material. In some embodiments, the liner layer 133 is formed by a deposition process, such as a CVD process, a PVD process, an ALD process, or another suitable method. After the liner layer 133 is formed, the sidewalls S5 and S6 of the lower opening 112a are also referred to as the tapered sidewalls of the liner layer 133, and the bottom surface B2 of the lower opening 112a is also referred to as the bottom surface of the liner layer 133.

Figure 16:
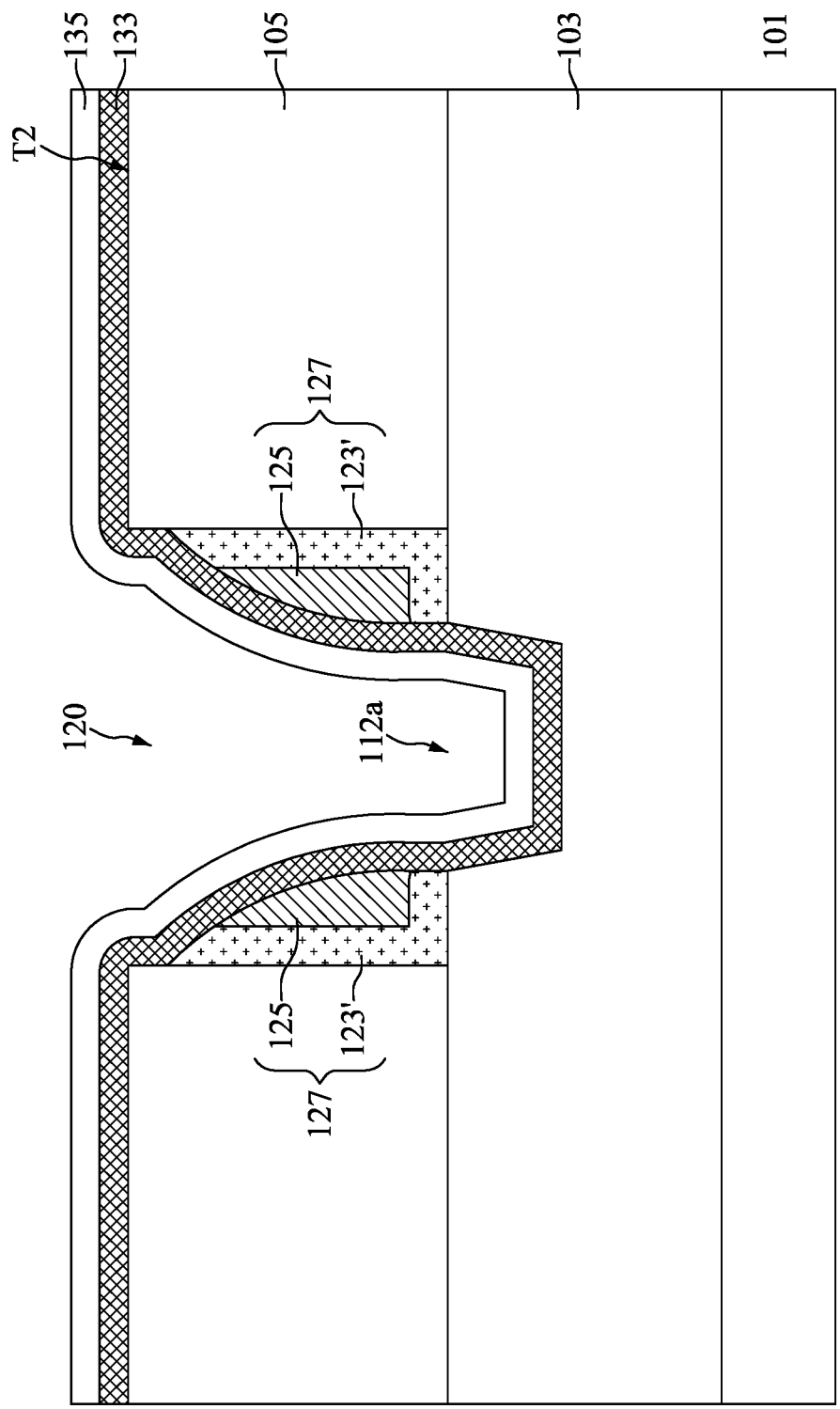
FIG. 16 is a cross-sectional view illustrating an intermediate stage of forming a barrier layer over the liner layer during the formation of the semiconductor device structure, in accordance with some embodiments.

Next, a barrier layer 135 is conformally formed over the liner layer 133, as shown in FIG. 16 in accordance with some embodiments. In some embodiments, the barrier layer 135 further extends over the top surface T2 of the second dielectric layer 105. In some embodiments, the barrier layer 135 is made of tantalum (Ta), tantalum nitride (TaN), titanium (Ti), titanium nitride (TiN), cobalt tungsten (CoW), another suitable material, or a combination thereof. Moreover, the barrier layer 135 may be formed by a deposition process, such as a CVD process, a PVD process, an ALD process, a metal organic chemical vapor deposition (MOCVD) process, a sputtering process, a plating process, or another suitable process.

Figure 17:
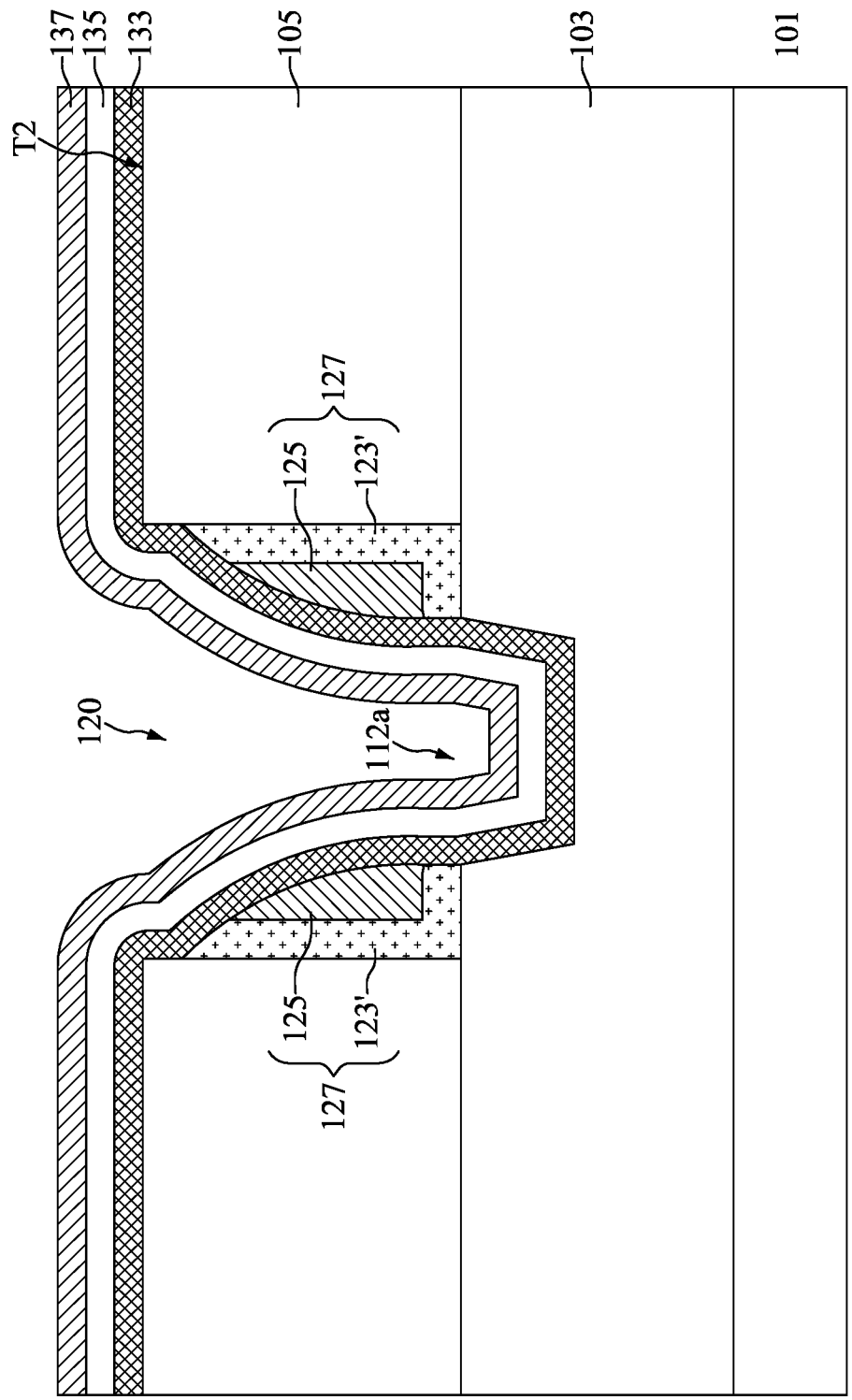
FIG. 17 is a cross-sectional view illustrating an intermediate stage of forming a metal layer over the barrier layer during the formation of the semiconductor device structure, in accordance with some embodiments.

Subsequently, a metal layer 137 is conformally formed over the barrier layer 135, as shown in FIG. 17 in accordance with some embodiments. In some embodiments, the metal layer 137 further extends over the top surface T2 of the second dielectric layer 105. In some embodiments, the metal layer 137 includes copper-containing alloy, such as copper-manganese (Cu—Mn) alloy. However, any other suitable materials, such as aluminum (Al), tungsten (W), titanium (Ti), tantalum (Ta), gold (Au), silver (Ag), may be utilized. Some processes used to form the metal layer 137 are similar to, or the same as those used to form the barrier layer 135 and details thereof are not repeated herein.

Figure 18:
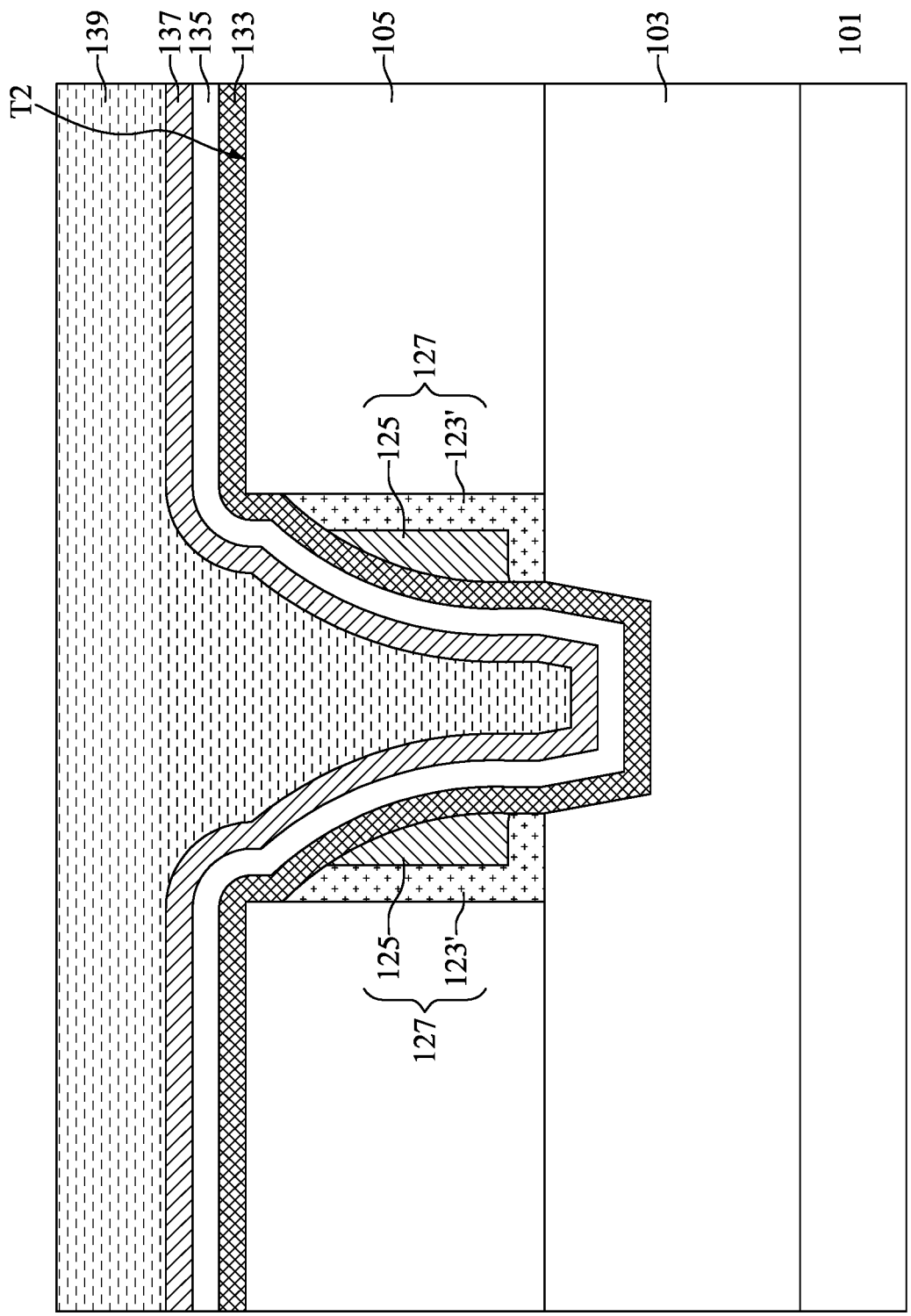
FIG. 18 is a cross-sectional view illustrating an intermediate stage of forming a metal filling portion over the metal layer during the formation of the semiconductor device structure, in accordance with some embodiments.

Then, a remaining portion of the enlarged upper opening 120 and a remaining portion of the lower opening 112a (if any) are filled by a metal filling portion 139, as shown in FIG. 18 in accordance with some embodiments. In some embodiments, the metal filling portion 139 further extends over the top surface T2 of the second dielectric layer 105. In some embodiments, the metal filling portion 139 includes copper (Cu). However, any other suitable materials, such as aluminum (Al), tungsten (W), titanium (Ti), tantalum (Ta), gold (Au), silver (Ag), may be utilized. Some processes used to form the metal filling portion 139 are similar to, or the same as those used to form the barrier layer 135 and details thereof are not repeated herein.

Next, a planarization process is performed on the metal filling portion 139, the metal layer 137, and the barrier layer 135 until the liner layer 133 is exposed, as shown in FIG. 1 in accordance with some embodiments. After the planarization process is performed, remaining portions of the metal filling portion 139, the metal layer 137, and the barrier layer 135 collectively form a conductive structure 141.

In some embodiments, the conductive structure 141 is surrounded by the liner layer 133 and the spacer structure 127. In some embodiments, the conductive structure 141 is separated from the second dielectric layer 105, the spacer structure 127, and the first dielectric layer 103 by the liner layer 133. The planarization process may include a chemical mechanical polishing (CMP) process. The respective step is illustrated as the step S27 in the method 10 shown in FIG. 4. After the conductive structure 141 is formed, the semiconductor device structure 100a is obtained.

In some embodiments, the liner layer 133 of the semiconductor device structure 100a has tapered sidewalls S1 and S2 in direct contact with the first dielectric layer 103, which helps to improve the step coverage of the liner layer 133 and the conductive structure 141 over the liner layer 133. Moreover, adequate step coverage of the conductive structure 141 can reduce electromigration. Furthermore, the porous low-k dielectric layer 125 of the spacer structure 127 can reduce the resistive-capacitive (RC) delay in signal propagation. As a result, performance and reliability of the semiconductor device structure can be improved.

Figure 19:
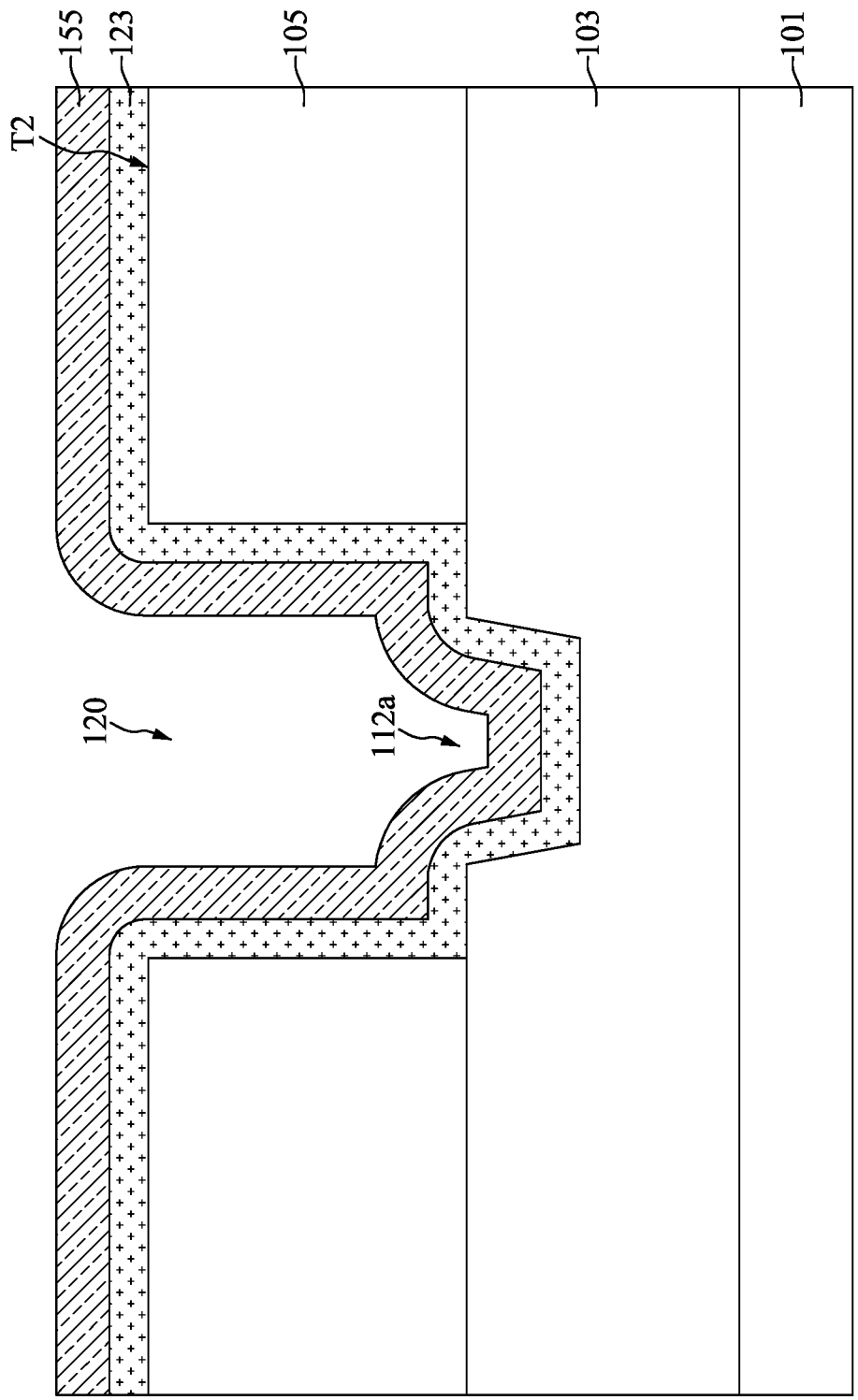
FIG. 19 is a cross-sectional view illustrating an intermediate stage of forming an energy removable layer over the liner material during the formation of the semiconductor device structure, in accordance with some other embodiments.
Figure 20:
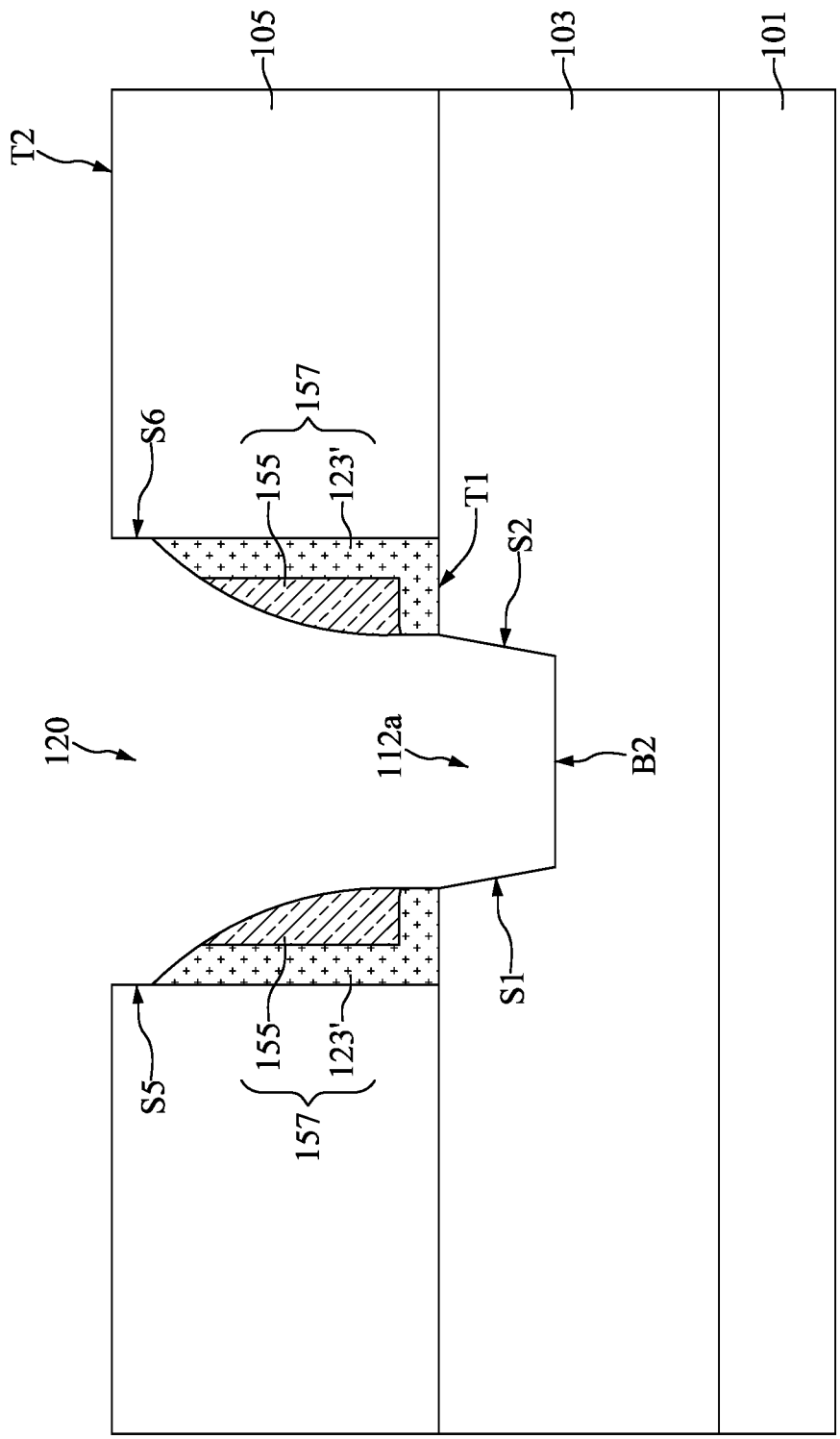
FIG. 20 is a cross-sectional view illustrating an intermediate stage of etching the energy removable layer and the liner material to form a spacer structure during the formation of the semiconductor device structure, in accordance with some other embodiments.

FIGS. 19 and 20 are cross-sectional views illustrating intermediate stages of forming the semiconductor device structures 100b and 100c, in accordance with some embodiments. It should be pointed out that operations for forming the semiconductor device structures 100b and 100c before the structure shown in FIG. 19 are substantially the same as the operations for forming the semiconductor device structure 100a shown in FIGS. 6-12 (The steps S31 to S39 in the method 30 shown in FIG. 5 are the same as the steps S11 to S19 in the method 10 shown in FIG. 4), and the related detailed descriptions may refer to the foregoing paragraphs and are not discussed again herein.

After the liner material 123 is formed lining the lower opening 112a and the enlarged upper opening 120, an energy removable layer 155 is formed over the liner material 123, as shown in FIG. 19 in accordance with some embodiments. The respective step is illustrated as the step S41 in the method 30 shown in FIG. 5. In some embodiments, the energy removable layer 155 is conformally formed over the structure of FIG. 12. In some embodiments, the energy removable layer 155 extends over the top surface T2 of the second dielectric layer 105.

In some embodiments, the energy removable layer 155 includes a thermal decomposable material. In some other embodiments, the energy removable layer 155 includes a photonic decomposable material, an e-beam decomposable material, or another suitable energy decomposable material. In some embodiments, the energy removable material includes a base material and a decomposable porogen material that is substantially removed once being exposed to an energy source (e.g., heat). In this case, the base material may include hydrogen silsesquioxane (HSQ), methylsilsesquioxane (MSQ), porous polyarylether (PAE), porous SiLK, or porous silicon oxide ($SiO_2$), and the decomposable porogen material may include a porogen organic compound, which can provide porosity to the space originally occupied by the energy removable layer 155 in the subsequent processes. In addition, the depositing of the energy removable layer 155 may include a CVD process, a PVD process, an ALD process, a spin-on coating process, or another suitable process.

Subsequently, an etching process (also referred to as a third etching process) is performed to partially remove the liner material 123 and the energy removable layer 155, such that a spacer structure 157 including the remaining portions of the liner material 123 and the energy removable layer 155 is obtained, as shown in FIG. 20 in accordance with some embodiments. The respective step is illustrated as the step S43 in the method 30 shown in FIG. 5. In some embodiments, the remaining portion of the liner material 123 has an "L" shape, which is referred to as an L-shaped liner 123'.

In some embodiments, after the third etching process is performed, the sidewalls S5 and S6 of the enlarged upper opening 120 are partially exposed by the spacer structure 157, and the sidewalls S1, S2 and the bottom surface B2 of the lower opening 112a are exposed. In some embodiments, the exposed portions of the sidewalls S5 and S6 are above the spacer structure 157. In some embodiments, the top surface T2 of the second dielectric layer 105 is exposed after the spacer structure 157 is formed.

In some embodiments, the liner material 123 and the energy removable layer 155 are etched by an anisotropic etching process, which removes the same amount of the liner material 123 and the energy removable layer 155 vertically in all places, leaving the spacer structure 157 on the lower portions of the sidewalls S5 and S6 of the second dielectric layer 105. In some embodiments, the third etching process is a dry etching process, such as plasma etching, RIE, NBE, or the like.

Then, a liner layer 133 is formed covering the spacer structure 157, and a conductive structure 141 including a barrier layer 135, a metal layer 137, and a metal filling portion 139 is formed over and surrounded by the liner layer 133, as shown in FIG. 2 in accordance with some embodiments. The respective steps are illustrated as the steps S45 and S47 in the method 30 shown in FIG. 5. Some materials and processes used to form the liner layer 133 and the conductive structure 141 of the semiconductor device structure 100b are similar to, or the same as, those used to form the liner layer 133 and the conductive structure 141 of the semiconductor device structure 100a, and details thereof are not repeated herein. After the conductive structure 141 is formed, the semiconductor device structure 100b is obtained. In the semiconductor device structure 100b, the energy removable layer 155 of the spacer structure 157 is enclosed by the L-shaped liner 123' and the liner layer 133.

After the semiconductor device structure 100b is obtained, a heat treatment process can be performed to transform the energy removable layer 155 of the spacer structure 157 into an air gap 160, as shown in FIG. 3 in accordance with some embodiments. The respective step is illustrated as the step S49 in the method 30 shown in FIG. 5. It should be noted that the step S49 is optional.

In some embodiments, the temperature used in the heat treatment process may be high enough to efficiently burn-out the energy removable layer 155, leaving the air gap 160 in the spacer structure 167. After the air gap 160 of the spacer structure 167 is formed, the semiconductor device structure 100c is obtained. In the semiconductor device structure 100c, the air gap 160 of the spacer structure 167 is enclosed by the L-shaped liner 123' and the liner layer 133.

In the embodiments of the semiconductor device structures 100b and 100c, the liner layer 133 has tapered sidewalls S1 and S2 in direct contact with the first dielectric layer 103, which helps to improve the step coverage of the liner layer 133 and the conductive structure 141 over the liner layer 133. Moreover, adequate step coverage of the conductive structure 141 can reduce electromigration. Furthermore, the energy removable layer 155 of the spacer structure 157 and the air gap 160 of the spacer structure 167 can reduce RC delay in signal propagation. As a result, performance and reliability of the semiconductor device structure can be improved.

Embodiments of the semiconductor device structure and method for preparing the same are provided in the disclosure. In some embodiments, the semiconductor device structure includes a first dielectric layer (e.g., the first dielectric layer 103) and a second dielectric layer (e.g., the second dielectric layer 105) disposed over the first dielectric layer, and a conductive structure (e.g., the conductive structure 141 including the barrier layer 135, the metal layer 137, and the metal filling portion 139) penetrating through the second dielectric layer and extending into the first dielectric layer. In some embodiments, the conductive structure is separated from the first dielectric layer by a liner layer (e.g., the liner layer 133), and the liner layer has tapered sidewalls (e.g., the sidewalls S1 and S2) in direct contact with the first dielectric layer.

Since the opening in the first dielectric layer (e.g., the lower opening 112a) has tapered sidewalls for the liner layer to line on, the conformity (i.e., the step coverage) of the liner layer can be improved, and the step coverage of the conductive structure disposed over the liner layer can also be improved. Adequate step coverage of the conductive structure can reduce electromigration. As a result, performance and reliability of the semiconductor device structure can be improved.

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a spacer structure disposed in the second dielectric layer, and a conductive structure penetrating through the second dielectric layer and extending into the first dielectric layer. The conductive structure is surrounded by the spacer structure. The semiconductor device structure further includes a liner layer separating the conductive structure from the first dielectric layer, the second dielectric layer and the spacer structure. The liner layer has a tapered sidewall in direct contact with the first dielectric layer.

In another embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a conductive structure penetrating through the second dielectric layer and extending into the first dielectric layer, and a liner layer covering a top surface of the second dielectric layer and surrounding the conductive structure. The liner layer has a tapered sidewall in direct contact with the first dielectric layer. The semiconductor device structure further includes a spacer structure disposed between the liner layer and the second dielectric layer. The spacer structure is in direct contact with a top surface of the first dielectric layer.

In yet another embodiment of the present disclosure, a method for preparing a semiconductor device structure is provided. The method includes forming a first dielectric layer over a semiconductor substrate, and forming a second dielectric layer over the first dielectric layer. The method also includes performing a first etching process to form an opening structure. The opening structure has a tapered profile, and the opening structure has a lower opening in the first dielectric layer and an upper opening in the second dielectric layer. The method further includes performing a second etching process to laterally extend the upper opening of the opening structure, such that a top surface of the first dielectric layer is exposed by an enlarged upper opening, and forming a spacer structure over the top surface of the first dielectric layer. In addition, the method includes forming a liner layer covering the spacer structure, and forming a conductive structure over and surrounded by the liner layer.

The embodiments of the present disclosure have some advantageous features. In some embodiment, the semiconductor device structure includes a first dielectric layer and a second dielectric layer disposed over the first dielectric layer, and a conductive structure penetrating through the second dielectric layer and extending into the first dielectric layer. In some embodiments, the conductive structure is separated from the first dielectric layer by a liner layer, and the liner layer has a tapered sidewall in direct contact with the first dielectric layer, thereby improving the step coverage of the liner layer and the overlying conductive structure. Moreover, adequate step coverage of the conductive structure can reduce electromigration. As a result, performance and reliability of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
   a first dielectric layer disposed over a semiconductor substrate;
   a second dielectric layer disposed over the first dielectric layer;
   a spacer structure disposed in the second dielectric layer and in contact with a lower portion of a sidewall of the second dielectric layer to expose an upper portion of the sidewall of the second dielectric layer;
   a conductive structure penetrating through the second dielectric layer and extending into the first dielectric layer, wherein the conductive structure is surrounded by the spacer structure; and
   a liner layer separating the conductive structure from the first dielectric layer, the second dielectric layer and the spacer structure, wherein the liner layer has a tapered sidewall in direct contact with the first dielectric layer, and an upper wall in direct contact with the top surface of the second dielectric layer and an upper portion of the sidewall of the second dielectric layer.

2. The semiconductor device structure of claim 1, wherein the spacer structure is in direct contact with a top surface of the first dielectric layer.

3. The semiconductor device structure of claim 1, wherein an angle between the tapered sidewall and a bottom surface of the liner layer is greater than 90 degrees.

4. The semiconductor device structure of claim 1, wherein the liner layer is in sequentially direct contact with the top surface and the upper portion of the sidewall of the second dielectric layer, a sidewall of the spacer structure and a sidewall of the first dielectric layer.

5. The semiconductor device structure of claim 1, wherein the conductive structure further comprises:
   a barrier layer having a top surface coplanar with a top surface of the liner layer; and
   a metal filling portion disposed over and surrounded by the barrier layer, wherein the metal filling portion comprises copper (Cu).

6. The semiconductor device structure of claim 5, wherein a top width of the metal filling portion is greater than a bottom width of the metal filling portion.

7. The semiconductor device structure of claim 5, wherein the conductive structure further comprises:
   a metal layer disposed between the barrier layer and the metal filling portion, wherein the metal layer comprises copper-manganese (Cu—Mn) alloy, wherein the metal layer has a top surface coplanar with the top surface of the liner layer.

8. The semiconductor device structure of claim 1, wherein the spacer structure further comprises an L-shaped liner having a top surface positioned below the top surface of the second dielectric layer.

9. The semiconductor device structure of claim 8, wherein the spacer structure further comprises an air gap enclosed by the L-shaped liner and the liner layer.

10. A semiconductor device structure, comprising:
    a first dielectric layer disposed over a semiconductor substrate;
    a second dielectric layer disposed over the first dielectric layer;
    a conductive structure penetrating through the second dielectric layer and extending into the first dielectric layer;
    a liner layer covering a top surface of the second dielectric layer and surrounding the conductive structure, wherein the liner layer has a tapered sidewall in direct contact with the first dielectric layer; and
    a spacer structure disposed between the liner layer and the second dielectric layer, wherein the spacer structure is in direct contact with a top surface of the first dielectric layer, wherein a top surface of the spacer structure is positioned below a top surface of the second dielectric layer.

11. The semiconductor device structure of claim 10, wherein the liner layer is in direct contact with a portion of sidewall of the second dielectric layer, a sidewall of the spacer structure and a sidewall of the conductive structure.

12. The semiconductor device structure of claim 10, wherein a bottom surface of the liner layer is higher than a bottom surface of the first dielectric layer, and an angle between the tapered sidewall and the bottom surface of the liner layer is greater than 90 degrees.

13. The semiconductor device structure of claim 10, wherein the conductive structure further comprises:
    a metal filling portion;
    a metal layer surrounding the metal filling portion; and
    a barrier layer surrounding the metal layer;
    wherein a top surface of the metal filling portion, a top surface of metal layer, a top surface of the barrier layer, and a top surface of the liner layer are coplanar with each other.

14. The semiconductor device structure of claim 13, wherein a top width of the metal filling portion is greater than a bottom width of the metal filling portion.

15. The semiconductor device structure of claim 13, wherein the metal filling portion comprises copper (Cu), and the metal layer comprises copper-manganese (Cu—Mn) alloy.

16. The semiconductor device structure of claim 10, wherein the spacer structure further comprises:
   an L-shaped liner in contact with the liner layer; and
   a porous low-k dielectric layer enclosed by the L-shaped liner and the liner layer.

17. The semiconductor device structure of claim 10, wherein the spacer structure further comprises:
   an L-shaped liner; and
   an energy removable layer enclosed by the L-shaped liner and the liner layer.

18. The semiconductor device structure of claim 10, wherein the spacer structure further comprises:
   an L-shaped liner; and
   an air gap enclosed by the L-shaped liner and the liner layer.

* * * * *